(12) United States Patent
Xu et al.

(10) Patent No.: US 9,209,103 B2
(45) Date of Patent: Dec. 8, 2015

(54) BATTERY HEATING CIRCUITS AND METHODS BASED ON BATTERY DISCHARGING AND CHARGING USING RESONANCE COMPONENTS IN SERIES AND CURRENT LIMITING COMPONENTS

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 683 days.

(21) Appl. No.: 13/187,266

(22) Filed: Jul. 20, 2011

(65) Prior Publication Data
US 2012/0025783 A1 Feb. 2, 2012

(30) Foreign Application Priority Data

Jul. 30, 2010 (CN) .......................... 2010 1 0245288
Aug. 30, 2010 (CN) .......................... 2010 1 0274785
Dec. 23, 2010 (CN) .......................... 2010 1 0603717
Dec. 23, 2010 (CN) .......................... 2010 1 0604714
Dec. 23, 2010 (CN) .......................... 2010 1 0604729
Dec. 23, 2010 (CN) .......................... 2010 1 0606082

(51) Int. Cl.
*H01M 10/46* (2006.01)
*H02J 7/00* (2006.01)
(Continued)

(52) U.S. Cl.
CPC ......... *H01L 23/345* (2013.01); *H01M 10/5006* (2013.01); *H01M 10/5016* (2013.01);
(Continued)

(58) Field of Classification Search
USPC .................................................. 320/128, 129
See application file for complete search history.

(56) References Cited

U.S. PATENT DOCUMENTS 3,654,426 A 4/1972 Brinkmann et al.
3,808,481 A 4/1974 Rippel
(Continued)

FOREIGN PATENT DOCUMENTS

CN 1630129 A 6/2005
CN 1630130 A 6/2005
(Continued)

OTHER PUBLICATIONS

European Patent Office, Extended European Search Report dated Sep. 13, 2011, in related application EP 11166955.2.
(Continued)

*Primary Examiner* — Drew A Dunn
*Assistant Examiner* — Jerry D Robbins
(74) *Attorney, Agent, or Firm* — Jones Day

(57) ABSTRACT

A circuit for heating a battery includes the battery including parasitic damping and current storage components, a switch unit, a switching control component coupled to the switch unit, a charge storage component, and a current limiting circuit. The damping component, current storage component, switch unit, and charge storage component are connected. The switching control component is configured to turn on and off the switch unit so as to control a first current flowing from the battery to the first charge storage component and a second current flowing from the first charge storage component to the battery. The current limiting circuit is configured to limit the second current flowing from the charge storage component to the battery. The circuit for heating the battery is configured to heat the battery by at least discharging and charging the battery.

32 Claims, 19 Drawing Sheets

(51) Int. Cl.
*H01L 23/34* (2006.01)
*H01M 10/615* (2014.01)
*H01M 10/625* (2014.01)
*H01M 10/657* (2014.01)
*H01M 10/6571* (2014.01)
*H01M 10/651* (2014.01)
*H01M 10/6572* (2014.01)
*H02M 3/158* (2006.01)

(52) U.S. Cl.
CPC ...... *H01M10/5081* (2013.01); *H01M 10/5083* (2013.01); *H01M 10/615* (2015.04); *H01M 10/625* (2015.04); *H01M 10/651* (2015.04); *H01M 10/657* (2015.04); *H01M 10/6571* (2015.04); *H01M 10/6572* (2015.04); *H02J 7/0054* (2013.01); *H01L 2924/0002* (2013.01); *H02J 7/0014* (2013.01); *H02J 7/0075* (2013.01); *H02J 7/0091* (2013.01); *H02J 7/0093* (2013.01); *H02M 3/158* (2013.03); *Y02E 60/12* (2013.01); *Y02T 10/7055* (2013.01)

(56) References Cited

U.S. PATENT DOCUMENTS

| | | | |
|---|---|---|---|
| 4,171,508 A | 10/1979 | Sinclair | |
| 4,184,197 A * | 1/1980 | Cuk et al. | 363/16 |
| 4,222,000 A | 9/1980 | Silvertown et al. | |
| 5,362,942 A * | 11/1994 | Vanderslice et al. | 219/209 |
| 5,396,165 A * | 3/1995 | Hwang et al. | 323/210 |
| 5,461,556 A | 10/1995 | Horie et al. | |
| 5,523,671 A | 6/1996 | Stewart | |
| 5,561,597 A | 10/1996 | Limpaecher | |
| 5,761,058 A | 6/1998 | Kanda et al. | |
| 5,768,114 A * | 6/1998 | Gruning et al. | 363/58 |
| 5,789,905 A * | 8/1998 | Yamasaki | 323/222 |
| 5,808,469 A | 9/1998 | Kopera | |
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A * | 6/2000 | Ashtiani et al. | 320/128 |
| 6,078,163 A | 6/2000 | Horie et al. | |
| 6,142,130 A | 11/2000 | Ward | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 * | 8/2004 | Orr et al. | 363/16 |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 | 1/2011 | Polivka et al. | |
| 8,004,866 B2 * | 8/2011 | Bucella et al. | 363/50 |
| 8,197,502 B2 * | 6/2012 | Smith et al. | 606/169 |
| 8,493,036 B2 | 7/2013 | Ferrario | |
| 2005/0077879 A1 * | 4/2005 | Near | 320/166 |
| 2005/0156578 A1 | 7/2005 | Karmenoff | |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0091023 A1 | 4/2007 | Kosaka et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 | 4/2011 | Hsieh et al. | |
| 2011/0144861 A1 | 6/2011 | Lakirovich et al. | |
| 2011/0273136 A1 | 11/2011 | Yoshimoto | |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1 | 2/2012 | Xu et al. | |
| 2012/0025780 A1 | 2/2012 | Xu et al. | |
| 2012/0025781 A1 | 2/2012 | Xu et al. | |
| 2012/0025782 A1 | 2/2012 | Xu et al. | |
| 2012/0031890 A1 | 2/2012 | Han et al. | |
| 2012/0032642 A1 | 2/2012 | Xu et al. | |
| 2012/0126753 A1 * | 5/2012 | Carkner | 320/129 |
| 2012/0161711 A1 | 6/2012 | Xu et al. | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

European Patent Office, Extended European Search Report dated Nov. 30, 2011, in related application EP 11166938.8.

European Patent Office, Extended European Search Report dated Dec. 15, 2011, in related application EP 11166941.2.

European Patent Office, Extended European Search Report dated Sep. 16, 2011, in related application EP 11166949.5.

(56) References Cited

OTHER PUBLICATIONS

European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Sep. 5, 2013, in related U.S. Appl. No. 13/189,096.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in related U.S. Appl. No. 13/187,890.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Notice of Allowance mailed Dec. 5, 2013, in related U.S. Appl. No. 13/166,281.
United States Patent and Trademark Office, Notice of Allowance mailed Nov. 8, 2013, in related U.S. Appl. No. 13/166,301.
United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Final Office Action mailed Feb. 25, 2014, in related U.S. Appl. No. 13/170,021.
United States Patent and Trademark Office, Office Action mailed Jan. 3, 2014, in related U.S. Appl. No. 13/184,906.
United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.

(56) References Cited

OTHER PUBLICATIONS

United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.
United States Patent and Trademark Office, Notice of Allowance mailed May 22, 2014, in related U.S. Appl. No. 13/170,044.
United States Patent and Trademark Office, Office Action mailed Sep. 26, 2014, in related U.S. Appl. No. 13/544,881.
United States Patent and Trademark Office, Office Action mailed Sep. 3, 2014, in related U.S. Appl. No. 13/486,883.
United States Patent and Trademark Office, Office Action mailed Sep. 11, 2014, in related U.S. Appl. No. 13/465,906.
United States Patent and Trademark Office, Office Action mailed Sep. 11, 2014, in related U.S. Appl. No. 13/545,885.
United States Patent and Trademark Office, Notice of Allowance mailed Oct. 6, 2014, in related U.S. Appl. No. 13/168,014.
United States Patent and Trademark Office, Notice of Allowance mailed Oct. 6, 2014, in related U.S. Appl. No. 13/184,906.
United States Patent and Trademark Office, Notice of Allowance mailed Oct. 6, 2014, in related U.S. Appl. No. 13/187,279.
United States Patent and Trademark Office, Notice of Allowance mailed Oct. 3, 2014, in related U.S. Appl. No. 13/187,890.
United States Patent and Trademark Office, Notice of Allowance mailed Oct. 7, 2014, in related U.S. Appl. No. 13/541,487.
United States Patent and Trademark Office, Notice of Allowance mailed Oct. 6, 2014, in related U.S. Appl. No. 13/748,525.
United States Patent and Trademark Office, Notice of Allowance mailed Oct. 6, 2014, in related U.S. Appl. No. 13/749,480.
United States Patent and Trademark Office, Office Action mailed Nov. 13, 2014, in related U.S. Appl. No. 13/168,004.
United States Patent and Trademark Office, Office Action mailed Dec. 11, 2014, in related U.S. Appl. No. 13/184,879.
United States Patent and Trademark Office, Office Action mailed Dec. 24. 2014, in related U.S. Appl. No. 13/184,894.
United States Patent and Trademark Office, Office Action mailed Dec. 31, 2014, in related U.S. Appl. No. 13/185,744.
United States Patent and Trademark Office, Office Action mailed Jan. 13, 2015, in related U.S. Appl. No. 13/184,915.
United States Patent and Trademark Office, Office Action mailed Dec. 31. 2014, in related U.S. Appl. No. 13/185,756.
United States Patent and Trademark Office, Office Action mailed Jul. 21, 2015, in related U.S. Appl. No. 13/545,885.
United States Patent and Trademark Office, Office Action mailed Apr. 1, 2015, in related U.S. Appl. No. 13/747,387.
United States Patent and Trademark Office, Office Action mailed Feb. 13, 2015, in related U.S. Appl. No. 13/465,906.
United States Patent and Trademark Office, Office Action mailed Apr. 13, 2015, in related U.S. Appl. No. 13/545,885.
United States Patent and Trademark Office, Notice of Allowance mailed Feb. 18, 2015, in related U.S. Appl. No. 13/168,004.
United States Patent and Trademark Office, Corrected Notice of Allowability mailed Apr. 3, 2015, in related U.S. Appl. No. 13/168,004.
United States Patent and Trademark Office, Corrected Notice of Allowability mailed May 13, 2015, in related U.S. Appl. No. 13/168,004.
United States Patent and Trademark Office, Notice of Allowance mailed Mar. 18, 2015, in related U.S. Appl. No. 13/184,879.
United States Patent and Trademark Office, Notice of Allowance mailed Mar. 27, 2015, in related U.S. Appl. No. 13/184,894.
United States Patent and Trademark Office, Corrected Notice of Allowability mailed May 20, 2015, in related U.S. Appl. No. 13/184,894.
United States Patent and Trademark Office, Notice of Allowance mailed Mar. 23, 2015, in related U.S. Appl. No. 13/185,744.
United States Patent and Trademark Office, Notice of Allowance mailed Mar. 30, 2015, in related U.S. Appl. No. 13/184,915.
United States Patent and Trademark Office, Corrected Notice of Allowability mailed May 21, 2015, in related U.S. Appl. No. 13/184,915.
United States Patent and Trademark Office, Corrected Notice of Allowability mailed Feb. 11, 2015, in related U.S. Appl. No. 13/187,279.
United States Patent and Trademark Office, Notice of Allowance mailed Apr. 29, 2015, in related U.S. Appl. No. 13/185,756.
United States Patent and Trademark Office, Notice of Allowance mailed Mar. 3, 2015, in related U.S. Appl. No. 13/544,881.
United States Patent and Trademark Office, Supplemental Notice of Allowability mailed Mar. 17, 2015, in related U.S. Appl. No. 13/544,881.
United States Patent and Trademark Office, Supplemental Notice of Allowability mailed May 20, 2015, in related U.S. Appl. No. 13/544,881.
United States Patent and Trademark Office, Notice of Allowance mailed Mar. 27, 2015, in related U.S. Appl. No. 13/747,378.
United States Patent and Trademark Office, Supplemental Notice of Allowability mailed May 13, 2015, in related U.S. Appl. No. 13/747,378.
United States Patent and Trademark Office, Notice of Allowance mailed Mar. 18, 2015, in related U.S. Appl. No. 13/486,883.
United States Patent and Trademark Office, Notice of Allowance mailed May 20, 2015, in related U.S. Appl. No. 13/465,906.
United States Patent and Trademark Office, Corrected Notice of Allowability mailed Feb. 23, 2015, in related U.S. Appl. No. 13/748,525.
United States Patent and Trademark Office, Notice of Allowance mailed Aug. 6, 2015, in related U.S. Appl. No. 13/747,387.
United States Patent and Trademark Office, Notice of Allowance mailed Sep. 14, 2015, in related U.S. Appl. No. 13/545,885.

* cited by examiner

BATTERY HEATING CIRCUITS AND METHODS BASED ON BATTERY DISCHARGING AND CHARGING USING RESONANCE COMPONENTS IN SERIES AND CURRENT LIMITING COMPONENTS

1. CROSS-REFERENCE TO RELATED APPLICATIONS

This application claims priority to the following six applications, all of which are incorporated by reference herein for all purposes.
 (i) Chinese Patent Application No. 201010245288.0, filed Jul. 30, 2010;
 (ii) Chinese Patent Application No. 201010274785.3, filed Aug. 30, 2010;
 (iii) Chinese Patent Application No. 201010604729.1, filed Dec. 23, 2010;
 (iv) Chinese Patent Application No. 201010603717.7, filed Dec. 23, 2010;
 (v) Chinese Patent Application No. 201010604714.5, filed Dec. 23, 2010; and
 (vi) Chinese Patent Application No. 201010606082.6, filed Dec. 23, 2010.

Additionally, this application is related to International Application Publication No. WO2010/145439A1 and Chinese Application Publication No. CN102055042A, both these two applications being incorporated by reference herein for all purposes. Moreover, U.S. patent application Ser. Nos. 13/168,004, 13/168,014, and 13/170,021 are incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

According to one embodiment, the battery heating circuit provided in the present invention, comprises a switch unit, a switching control module, a damping component R1, an energy storage circuit, and an energy limiting circuit, wherein: the energy storage circuit is connected with the battery and comprises a current storage component L1 and a charge storage component C1; the damping component R1, the switch unit, the current storage component L1, and the charge storage component C1 are connected in series; the switching control module is connected with the switch unit, and is configured to control ON/OFF of the switch unit, so that the energy can flow back-and-forth between the battery and the energy storage circuit when the switch unit switches on; the energy limiting circuit is configured to limit the magnitude of current flowing from the energy storage circuit to the battery.

According to some embodiments, the heating circuit provided in the present invention can improve the charge/discharge performance of the battery; in addition, for example, since the energy storage circuit is connected with the battery in series in the heating circuit, safety problem caused by over-current that results from short circuit and failure of the switch unit can be avoided when the battery is heated due to the existence of the charge storage components C1 connected in series, and therefore the battery can be protected effectively.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
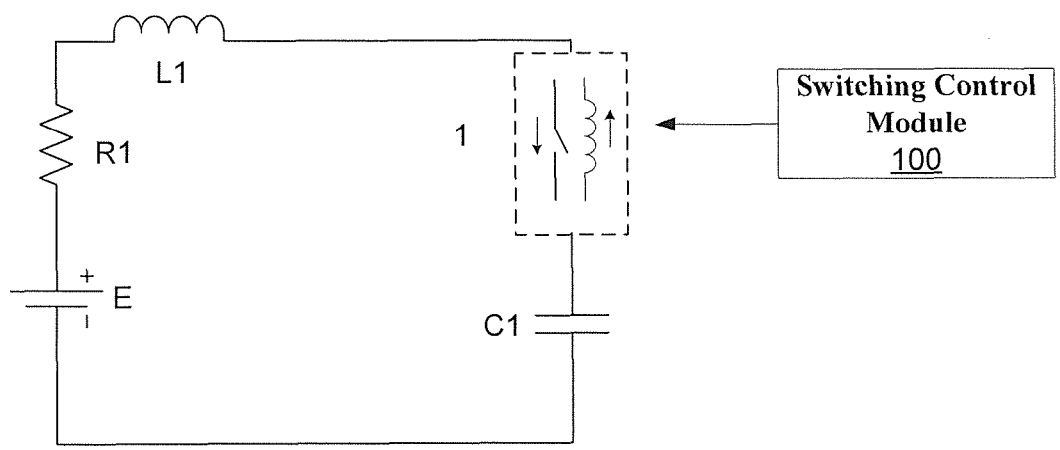
FIG. 1 is a schematic diagram showing a battery heating circuit including an energy limiting circuit according to one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

In order to heat up the battery E located in a low temperature environment, one embodiment of the present invention provides a battery heating circuit; as shown in FIG. 1, the battery heating circuit comprises a switch unit 1, a switching control module 100, a damping component R1, an energy storage circuit, and an energy limiting circuit, wherein: the energy storage circuit is connected with the battery, and comprises a current storage component L1 and a charge storage component C1; the damping component R1, the switch unit 1, the current storage component L1, and charge storage component C1 are connected in series; the switching control module 100 is connected with the switch unit 1, and is configured to control ON/OFF of the switch unit 1, so that the energy can flow back-and-forth between the battery and the energy storage circuit when the switch unit 1 switches on; the energy limiting circuit is configured to limit the magnitude of current flowing from the energy storage circuit to the battery.

It should be noted specially that, considering different types of batteries have different characteristics, in certain embodiments of the present invention, if the battery E has very high internal parasitic resistance and parasitic inductance, the damping component R1 could refer to the parasitic resistance in the battery pack; likewise, the current storage component L2 could refer to the parasitic inductance in the battery pack.

The switch unit 1 is connected in series with the energy storage circuit; when the switch unit 1 switches on, the energy can flows back-and-forth between the battery E and the energy storage circuit; the switch unit 1 can be implemented in a variety of ways, and certain embodiments of the present invention do not impose any limitation to the implementation of the switch unit. The switch unit may comprise a first one-way branch configured to implement energy flowing from the battery to the energy storage circuit, a second one-way branch configured to implement energy flowing from the energy storage circuit to the battery; the switching control module 100 is connected with either or both of the first one-way branch and second one-way branch, so as to control ON/OFF of the connected branches. The energy limiting circuit may comprise a current storage component L11, which is connected in series in the second one-way branch, and is configured to limit the amplitude of the current flowing to the battery E.

Figure 2:
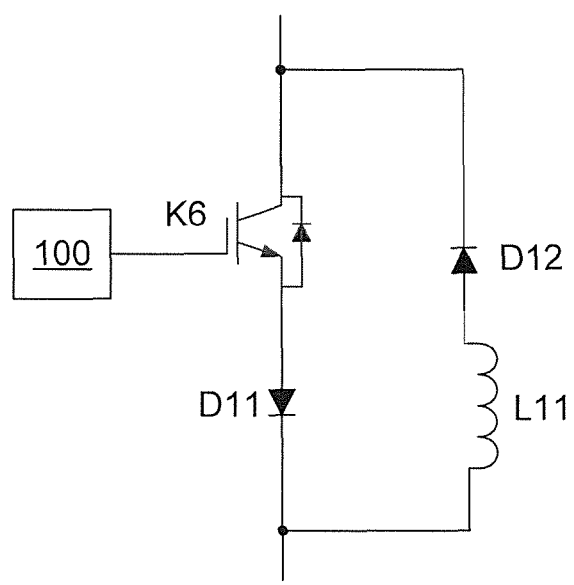
FIG. 2 is a schematic diagram showing the switch unit with the energy limiting circuit as part of the battery heating circuit as shown in FIG. 1 according to one embodiment of the present invention.

In one embodiment of switch unit 1, as shown in FIG. 2, the switch unit 1 may comprise a switch K6, a one-way semiconductor component D11, and a one-way semiconductor component D12, wherein: the switch K6 and the one-way semiconductor component D11 are connected in series with each other to form the first one-way branch; the one-way semiconductor component D12 forms the second one-way branch; the switching control module 100 is connected with the switch K6, to control ON/OFF of the first one-way branch by controlling ON/OFF of the switch K6. In the switch unit 1 shown in FIG. 8, when heating is needed, the switch K6 can be controlled to switch on; when heating is not needed, the switch K6 can be controlled to switch off.

Figure 3:
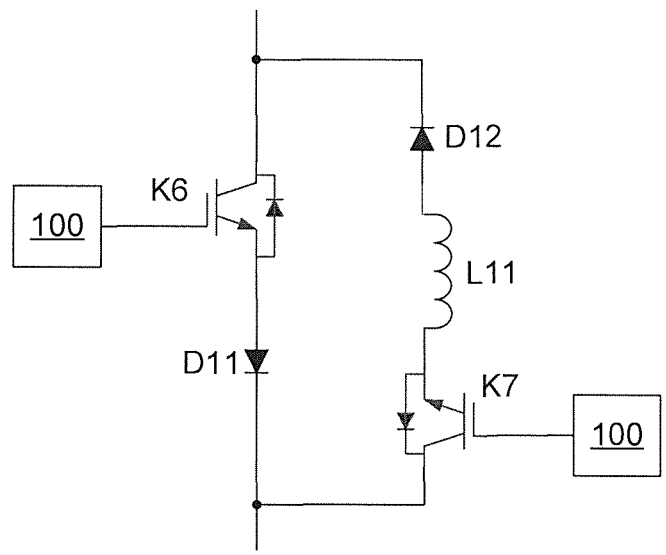
FIG. 3 is a schematic diagram showing the switch unit with the energy limiting circuit as part of the battery heating circuit as shown in FIG. 1 according to another embodiment of the present invention.

Though the implementation of switch unit 1 shown in FIG. 2 enables to-and-fro energy flow along separate branches, it cannot enable energy flow cut-off function in reverse direction. The present invention further puts forward another embodiment of switch unit 1; as shown in FIG. 3, the switch unit 1 can further comprise a switch K7 in the second one-way branch, wherein: the switch K7 is connected with the one-way semiconductor component D12 in series, the switching control module 100 is also connected with the switch K7, and is configured to control ON/OFF of the second one-way branch by controlling ON/OFF of the switch K7. Thus, in the switch unit 1 shown in FIG. 3, since there are switches (i.e., switch K6 and switch K7) in both one-way branches, energy flow cut-off function in forward direction and reverse direction is enabled simultaneously.

The current storage component L11 is connected between the one-way semiconductor component D12 and the switch K7, to limit the current flowing to the battery E.

In the heating process described above, when the current flows from the energy storage circuit back to the battery E, the energy in the charge storage component C1 will not flow back to the battery E completely; instead, some energy will remain in the charge storage component C1, and ultimately the voltage across the charge storage component C1 is close or equal to the voltage of the battery, and therefore the energy flow from the battery E to the charge storage component C1 cannot continue anymore; that phenomenon is adverse to the cyclic operation of the heating circuit. Therefore, in one embodiment of the present invention, an additional unit that implements the functions such as superposing the energy in the charge storage component C1 with the energy in the battery E, or transferring the energy in the charge storage component C1 to another energy storage component is added. At an appropriate time, the switch unit 1 is controlled to switch off, and the energy in the charge storage component C1 is superposed or transferred, for example. The switch unit 1 can be controlled to switch off at any time in one or more cycles; the switch unit 1 can be controlled to switch off at any time, for example, when the current flowing in the circuit is in forward direction/reverse direction, and when the current is zero or not zero. A specific implementation form of switch unit 1 can be selected, depending on the needed cut-off strategy; if current flowing cut-off in forward direction is only needed, the implementation form of switch unit 1 shown in FIG. 2 can be selected; if current flowing cut-off in forward direction and reverse direction is needed, the switch unit with two controllable one-way branches shown in FIG. 3 can be selected. Preferably, the switching control module 100 is configured to control the switch unit 1 to switch off when the current flowing though the switch unit 1 is zero after the switch unit 1 switches on, so as to improve the working efficiency of the circuit. In addition, the disturbance to the entire circuit is minimal if the switch unit 1 switches off when the current flowing in the circuit is zero.

Figure 4:
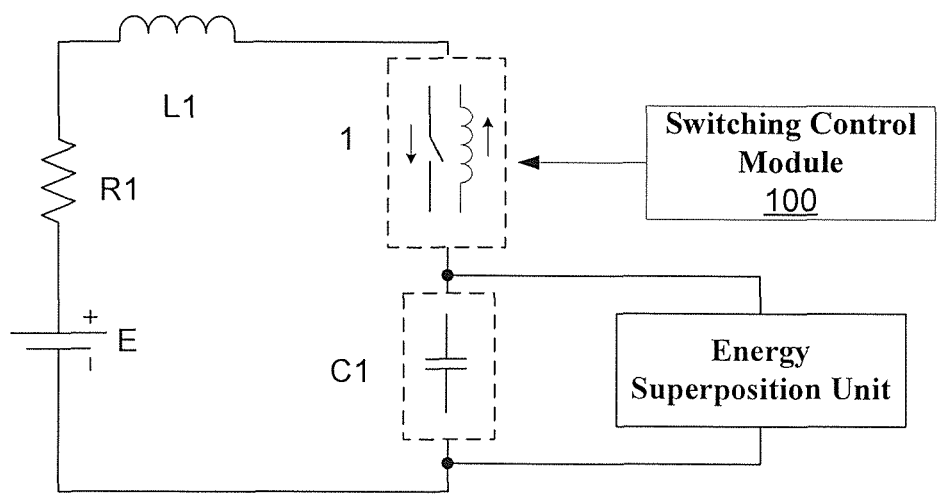
FIG. 4 is a schematic diagram showing a battery heating circuit including an energy limiting circuit and an energy superposition unit according to another embodiment of the present invention.

To improve heating efficiency, in one embodiment of the present invention, as shown in FIG. 4, the heating circuit can comprise an energy superposition unit, which is connected with the energy storage circuit, and is configured to superpose the energy in the energy storage circuit with the energy in the battery E after the switch unit 1 switches on and then switches off. With the energy superposition unit, the discharging current in the heating loop can be increased when the switch unit 1 switches on again, and thereby the working efficiency of the heating circuit is improved.

Figure 5:
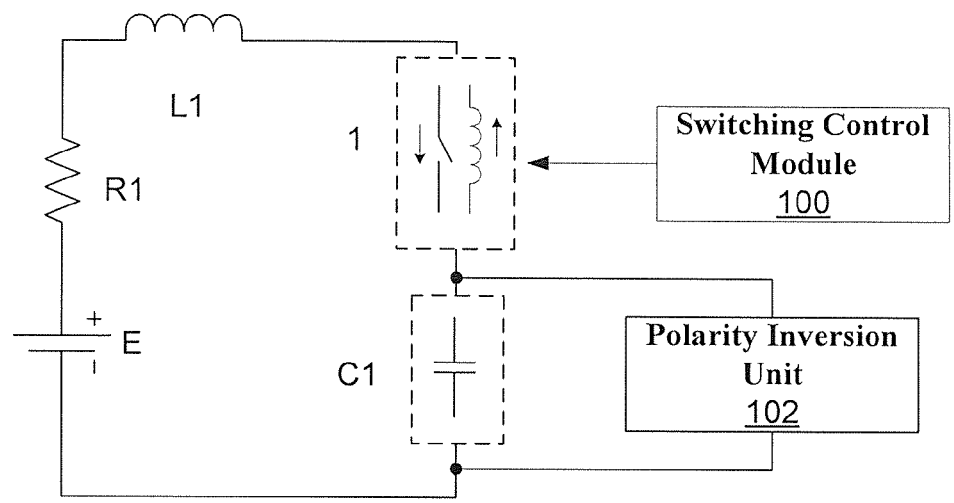
FIG. 5 is a schematic diagram showing the energy superposition unit as part of the battery heating circuit as shown in FIG. 4 according to one embodiment of the present invention.

In one embodiment of the present invention, as shown in FIG. 5, the energy superposition unit comprises a polarity inversion unit 102, which is connected with the energy storage circuit, and is configured to invert the voltage polarity of the charge storage component C1 after the switch unit 1 switches on and then switches off. Since the voltage of the charge storage component C1 can be superposed in series with the voltage of the battery E after polarity inversion, the discharging current in the heating loop will be increased when the switch unit 1 switches on again.

Figure 6:
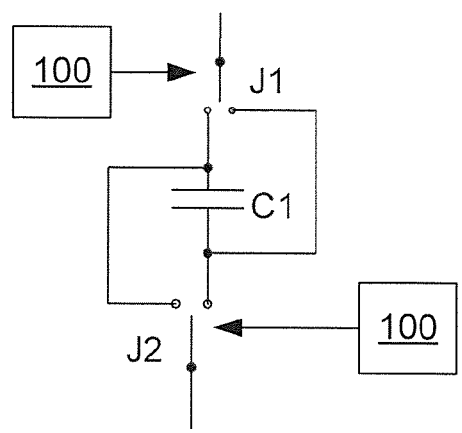
FIG. 6 is a schematic diagram showing the polarity inversion unit for the energy superposition unit as part of the battery heating circuit as shown in FIG. 5 according to one embodiment of the present invention.

As one embodiment of the polarity inversion unit 102, as shown in FIG. 6, the polarity inversion unit 102 comprises a single-pole double-throw switch J1 and a single-pole double-throw switch J2 located on the two ends of the charge storage component C1 respectively; the input wires of the single-pole double-throw switch J1 are connected in the energy storage circuit, the first output wire of the single-pole double-throw switch J1 is connected with the first pole plate of the charge storage component C1, and the second output wire of the single-pole double-throw switch J1 is connected with the second pole plate of the charge storage component C1; the input wires of the single-pole double-throw switch J2 are connected in the energy storage circuit, the first output wire of the single-pole double-throw switch J2 is connected with the second pole plate of the charge storage component C1, and the second output wire of the single-pole double-throw switch J2 is connected with the first pole plate of the charge storage component C1; the switching control module 100 is also connected with the single-pole double-throw switch J1 and single-pole double-throw switch J2 respectively, and is configured to invert the voltage polarity of the charge storage component C1 by altering the connection relationships between the respective input wires and output wires of the single-pole double-throw switch J1 and the single-pole double-throw switch J2.

According to this embodiment, the connection relationships between the respective input wires and output wires of the single-pole double-throw switch J1 and single-pole double-throw switch J2 can be set in advance, so that the input wires of the single-pole double-throw switch J1 are connected with the first output wire of the switch unit K1 and the input wires of the single-pole double-throw switch J2 are connected with the first output wire of the switch unit K1 when the switch unit K1 switches on; the input wires of the single-pole double-throw switch J1 are switched to connect with the second output wire of the switch unit K1 and the input wires of the single-pole double-throw switch J2 are switched to connect with the second output wire of the switch unit K1 under control of the switching control module 100 when the switch unit K1 switches off, and thereby the voltage polarity of the charge storage component C1 is inverted.

Figure 7:
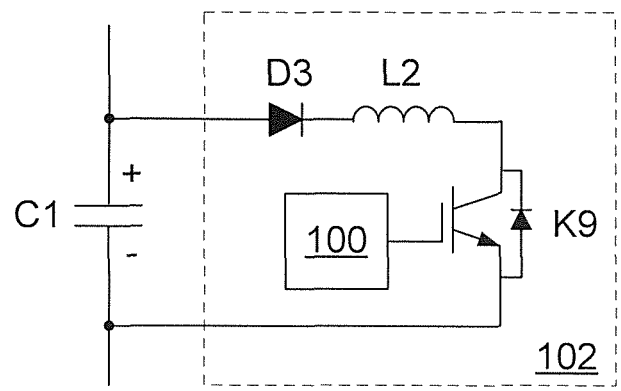
FIG. 7 is a schematic diagram showing the polarity inversion unit for the energy superposition unit as part of the battery heating circuit as shown in FIG. 5 according to another embodiment of the present invention.

As another embodiment of the polarity inversion unit 102, as shown in FIG. 7, the polarity inversion unit 102 comprises a one-way semiconductor component D3, a current storage component L2, and a switch K9; the charge storage component C1, current storage component L2, and switch K9 are connected sequentially in series to form a loop; the one-way semiconductor component D3 is connected in series between the charge storage component C1 and the current storage component L2 or between the current storage component L2 and the switch K9; the switching control module 100 is also connected with the switch K9, and is configured to invert the voltage polarity of the charge storage component C1 by controlling the switch K9 to switch on.

According to the above embodiment, when the switch unit 1 switches off, the switch K9 can be controlled to switch on by the switching control module 100, and thereby the charge storage component C1, one-way semiconductor component D3, current storage component L2, and switch K9 form a LC oscillation loop, and the charge storage component C1 discharges through the current storage component L2, thus, the voltage polarity of the charge storage component C1 will be inverted when the current flowing through the current storage component L2 reaches zero after the current in the oscillation circuit flows through the positive half cycle.

Figure 8:
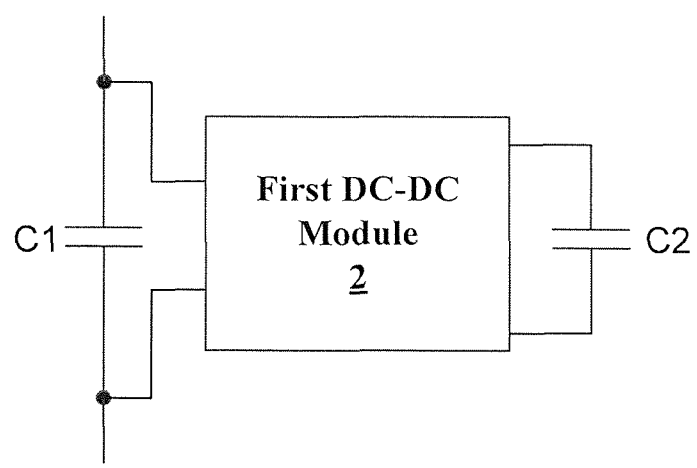
FIG. 8 is a schematic diagram showing the polarity inversion unit for the energy superposition unit as part of the battery heating circuit as shown in FIG. 5 according to yet another embodiment of the present invention.

As yet another embodiment of the polarity inversion unit 102, as shown in FIG. 8, the polarity inversion unit 102 comprises a first DC-DC module 2 and a charge storage component C2; the first DC-DC module 2 is connected with the charge storage component C1 and the charge storage component C2 respectively; the switching control module 100 is also connected with the first DC-DC module 2, and is configured to transfer the energy in the charge storage component C1 to the charge storage component C2 by controlling the operation of the first DC-DC module 2, and then transfer the energy in the charge storage component C2 back to the charge storage component C1, so as to invert the voltage polarity of the charge storage component C1.

The first DC-DC module 2 is a DC-DC (direct current to direct current) conversion circuit for voltage polarity inversion commonly used in the field. Certain embodiments of the present invention do not impose any limitation to the specific circuit structure of the first DC-DC module 2, as long as the module can accomplish voltage polarity inversion of the charge storage component C1 according to some embodiments. Those skilled in the art can add, substitute, or delete the components in the circuit as needed.

Figure 9:
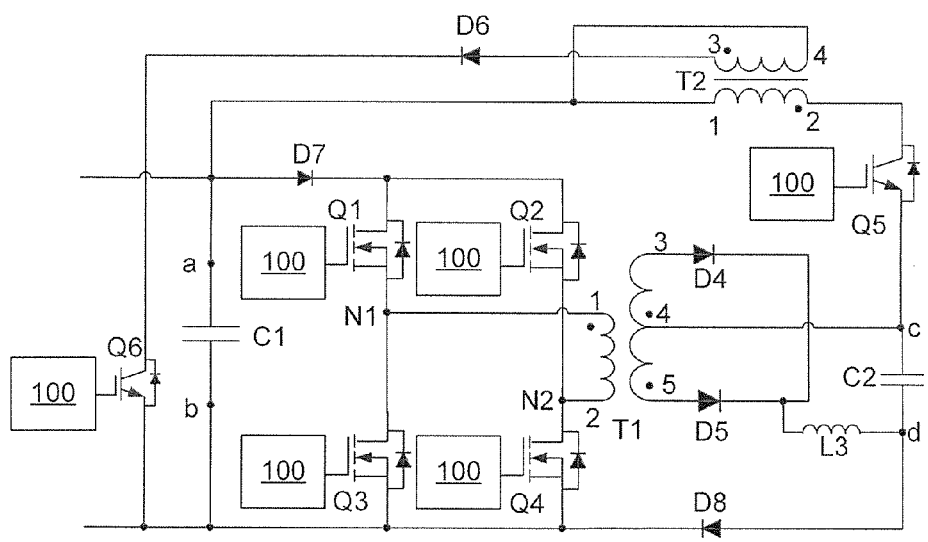
FIG. 9 is a schematic diagram showing the DC-DC module for the energy superposition unit as part of the battery heating circuit as shown in FIG. 8 according to one embodiment of the present invention.

FIG. 9 shows one embodiment of the first DC-DC module 2 provided in the present invention. As shown in FIG. 9, the first DC-DC module 2 comprises: a two-way switch Q1, a two-way switch Q2, a two-way switch Q3, a two-way switch Q4, a first transformer T1, a one-way semiconductor component D4, a one-way semiconductor component D5, a current storage component L3, a two-way switch Q5, a two-way switch Q6, a second transformer T2, a one-way semiconductor component D6, a one-way semiconductor component D7, and a one-way semiconductor component D8.

In the embodiment, the two-way switch Q1, two-way switch Q2, two-way switch Q3, and two-way switch Q4 are MOSFETs, and the two-way switch Q5 and two-way switch Q6 are IGBTs.

The Pin 1, 4, and 5 of the first transformer T1 are dotted terminals, and the pin 2 and 3 of the second transformer T2 are dotted terminals.

Wherein: the positive electrode of the one-way semiconductor component D7 is connected with the end 'a' of the charge storage component C1, and the negative electrode of the one-way semiconductor component D7 is connected with the drain electrodes of the two-way switch Q1 and two-way switch Q2, respectively; the source electrode of the two-way switch Q1 is connected with the drain electrode of the two-way switch Q3, and the source electrode of the two-way switch Q2 is connected with the drain electrode of the two-way switch Q4; the source electrodes of the two-way switch Q3 and two-way switch Q4 are connected with the end 'b' of the charge storage component C1 respectively. Thus, a full-bridge circuit is formed, here, the voltage polarity of end 'a' of the charge storage component C1 is positive, while the voltage polarity of end 'b' of the charge storage component C1 is negative.

In the full-bridge circuit, the two-way switch Q1, two-way switch Q2 constitute the upper bridge arm, while the two-way switch Q3 and two-way switch Q4 constitute the lower bridge arm. The full-bridge circuit is connected with the charge storage component C2 via the first transformer T1; the pin 1 of the first transformer T1 is connected with the first node N1, the pin 2 of the first transformer T1 is connected with the second node N2, the pin 3 and pin 5 of the first transformer T1 are connected to the positive electrode of the one-way semiconductor component D4 and the positive electrode of the one-way semiconductor component D5 respectively; the negative electrode of one-way semiconductor component D4 and the negative electrode of one-way semiconductor component D5 are connected with one end of the current storage component L3, and the other end of the current storage component L3 is connected with the end 'd' of the charge storage component C2; the pin 4 of the transformer T1 is connected with the end 'c' of the charge storage component C2, the positive electrode of the one-way semiconductor component D8 is connected with the end 'd' of the charge storage component C2, and the negative electrode of the one-way semiconductor component D8 is connected with the end 'b' of the charge storage component C1; here, the voltage polarity of end 'c' of the charge storage component C2 is negative, while the voltage polarity of end 'd' of the charge storage component C2 is positive.

Wherein: the end 'c' of the charge storage component C2 is connected with the emitter electrode of the two-way switch Q5, the collector electrode of the two-way switch Q5 is connected with the pin 2 of the transformer T2, the pin 1 of the transformer T2 is connected with end 'a' of the charge storage component C1, the pin 4 of the transformer T2 is connected with end 'a' of the charge storage component C1, the pin 3 of the transformer T2 is connected with the positive electrode of the one-way semiconductor component D6, the negative electrode of the one-way semiconductor component D6 is connected with the collector electrode of the two-way switch Q6, and the emitter electrode of the two-way switch Q6 is connected with the end 'b' of the charge storage component C2.

Wherein: the two-way switch Q1, two-way switch Q2, two-way switch Q3, two-way switch Q4, two-way switch Q5, and two-way switch Q6 are controlled by the switching control module 100 respectively to switch on and switch off.

Hereafter the working process of the first DC-DC module 2 will be described:

1. After the switch unit 1 switches off, the switching control module 100 controls the two-way switch Q5 and two-way switch Q6 to switch off, and controls the two-way switch Q1 and two-way switch Q4 to switch on at the same time to form phase A; controls the two-way switch Q2 and two-way switch Q3 to switch on at the same time to form phase B. Thus, by controlling the phase A and phase B to switch on alternately, a full-bridge circuit is formed;

2. When the full-bridge circuit operates, the energy in the charge storage component C1 is transferred through the first transformer T1, one-way semiconductor component D4, one-way semiconductor component D5, and current storage component L3 to the charge storage component C2; now, the voltage polarity of end 'c' of the charge storage component C2 is negative, while the voltage polarity of end 'd' of the charge storage component C2 is positive.

3. The switching control module 100 controls the two-way switch Q5 to switch on, and therefore a path from the charge storage component C1 to the charge storage component C2 is formed via the second transformer T2 and the one-way semiconductor component D8, thus, the energy in the charge storage component C2 is transferred back to the charge storage component C1, wherein: some energy will be stored in the second transformer T2, Now, the switching control module 100 controls the two-way switch Q5 to switch off and controls the two-way switch Q6 to switch on, and therefore the energy stored in the second transformer T2 is transferred to the charge storage component C1 by the second transformer T2 and the one-way semiconductor component D6; now, the voltage polarity of the charge storage component C1 is inverted such that end 'a' is negative and end 'b' is positive. Thus, the purpose of inverting the voltage polarity of the charge storage component C1 is attained.

Figure 10:
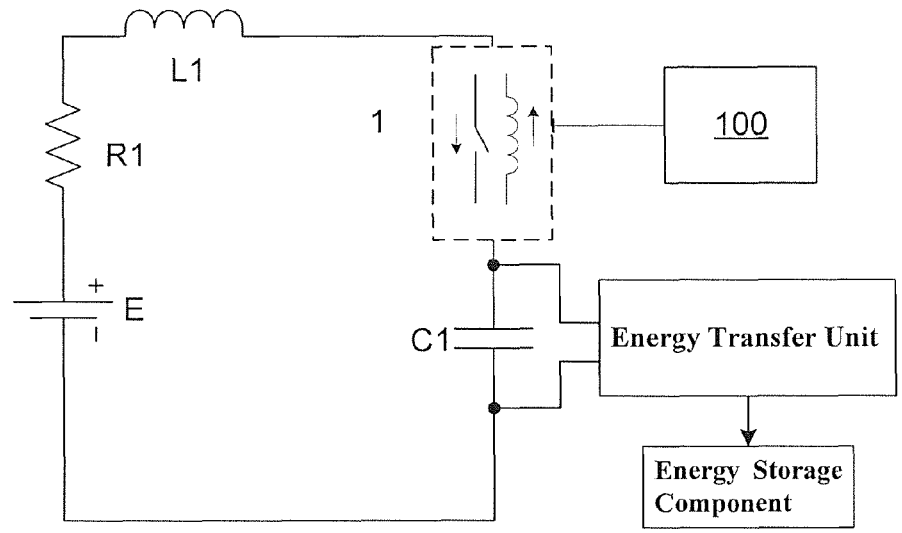
FIG. 10 is a schematic diagram showing a battery heating circuit including an energy limiting circuit and an energy transfer unit according to yet another embodiment of the present invention.

To recycle the energy in the energy storage circuit, in one embodiment of the present invention, as shown in FIG. 10, the heating circuit may comprise an energy transfer unit, which is connected with the energy storage circuit, and is configured to transfer the energy in the energy storage circuit to the energy storage component after the switch unit 1 switches on and then switches off. The purpose of the energy transfer unit is to recycle the energy in the energy storage circuit. The energy storage component can be an external capacitor, a low temperature battery or electric network, or an electrical device.

Figure 11:
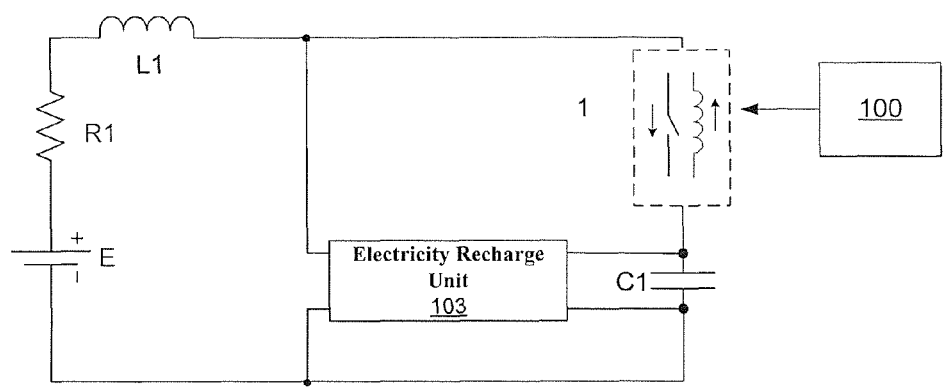
FIG. 11 is a schematic diagram showing the energy transfer unit as part of the battery heating circuit as shown in FIG. 10 according to one embodiment of the present invention.

Preferably, the energy storage component is the battery E provided in certain embodiments of the present invention, the energy transfer unit comprises an electricity recharge unit 103, which is connected with the energy storage circuit, and is configured to transfer the energy in the energy storage circuit to the battery E after the switch unit 1 switches on and then switches off, as shown in FIG. 11.

In the technical solution of certain embodiments of the present invention, after the switch unit 1 switches off, the energy in the energy storage circuit is transferred by the energy transfer unit to the battery E, so that the transferred energy can be recycled after the switch unit 1 switches on again, and thereby the working efficiency of the heating circuit is improved.

Figure 12:
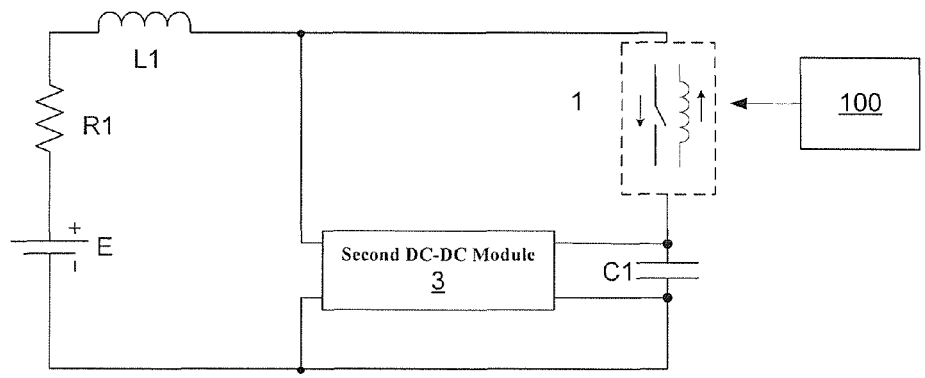
FIG. 12 is a schematic diagram showing the electricity recharge unit for the energy transfer unit as part of the battery heating circuit as shown in FIG. 11 according to one embodiment of the present invention.

In one embodiment of the electricity recharge unit 103, as shown in FIG. 12, the electricity recharge unit 103 comprises a second DC-DC module 3, which is connected with the charge storage component C1 and the battery E respectively; the switching control module 100 is also connected with the second DC-DC module 3, and is configured to control the operation of the second DC-DC module 3, so as to transfer the energy in the charge storage component C1 to the battery E.

The second DC-DC module 3 is a DC-DC (direct current to direct current) conversion circuit for energy transfer commonly used in the field. Certain embodiments of the present invention do not impose any limitation to the specific circuit structure of the second DC-DC module 3, as long as the module can transfer the energy in the charge storage component C1 according to some embodiments. Those skilled in the art can add, substitute, or delete the components in the circuit as needed.

Figure 13:
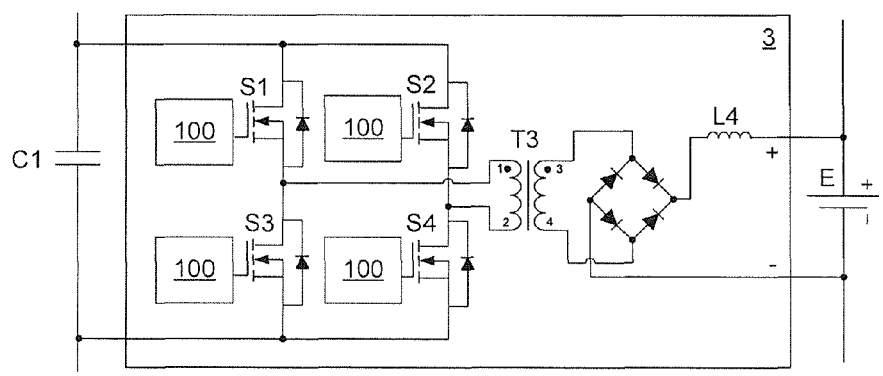
FIG. 13 is a schematic diagram showing the second DC-DC module for electricity recharge unit as part of the battery heating circuit as shown in FIG. 12 according to one embodiment of the present invention.

FIG. 13 shows one embodiment of the second DC-DC module 3 provided in the present invention. As shown in FIG. 13, the second DC-DC module 3 comprises: a two-way switch S1, a two-way switch S2, a two-way switch S3, a two-way switch S4, a third transformer T3, a current storage component L4, and four one-way semiconductor components. In the embodiment, the two-way switch S1, two-way switch S2, two-way switch S3, and two-way switch S4 are MOSFETs.

Wherein: the pin 1 and pin 3 of the third transformer T3 are dotted terminals; the negative electrodes of two one-way semiconductor components among the four one-way semiconductor components are connected into a group and their junction point is connected with the positive pole of the battery E through the current storage component L4; the positive electrodes of the other two one-way semiconductor components are connected into a group and their junction point is connected with the negative pole of the battery E; in addition, the junction points between the groups are connected with pin 3 and pin 4 of the third transformer T3 respectively, and thereby form a bridge rectifier circuit.

Wherein: the source electrode of the two-way switch S1 is connected with the drain electrode of the two-way switch S3, the source electrode of the two-way switch S2 is connected with the drain electrode of the two-way switch S4, the drain electrodes of the two-way switch S1 and two-way switch S2 are connected with the positive end of the charge storage component C1 respectively, the source electrodes of the two-way switch S3 and two-way switch S4 are connected with the negative end of the charge storage component C1 respectively; thus, a full-bridge circuit is formed.

In the full-bridge circuit, the two-way switch S1 and two-way switch S2 constitute the upper bridge arm, and the two-way switch S3 and two-way switch S4 constitute the lower bridge arm; the pin 1 of the third transformer T3 is connected with the node between two-way switch S1 and two-way switch S3, and the pin 2 of the third transformer T3 is connected with the node between two-way switch S2 and two-way switch S4.

Wherein: the two-way switch S1, two-way switch S2, two-way switch S3, and two-way switch S4 are controlled by the switching control module 100 respectively to switch on and switch off.

Hereafter the working process of the second DC-DC module 3 will be described:

1. After the switch unit 1 switches off, the switching control module 100 controls the two-way switch S1 and two-way switch S4 to switch on at the same time to form phase A; and controls the two-way switch S2 and two-way switch S3 to switch on at the same time to form phase B. Thus, by controlling the phase A and phase B to switch on alternately, a full-bridge circuit is formed;

2. When the full-bridge circuit operates, the energy in charge storage component C1 is transferred to the battery E through the third transformer T3 and rectifier circuit; and the rectifier circuit converts the AC input into DC and outputs the DC to the battery E, to attain the purpose of electricity recharge.

Figure 14:
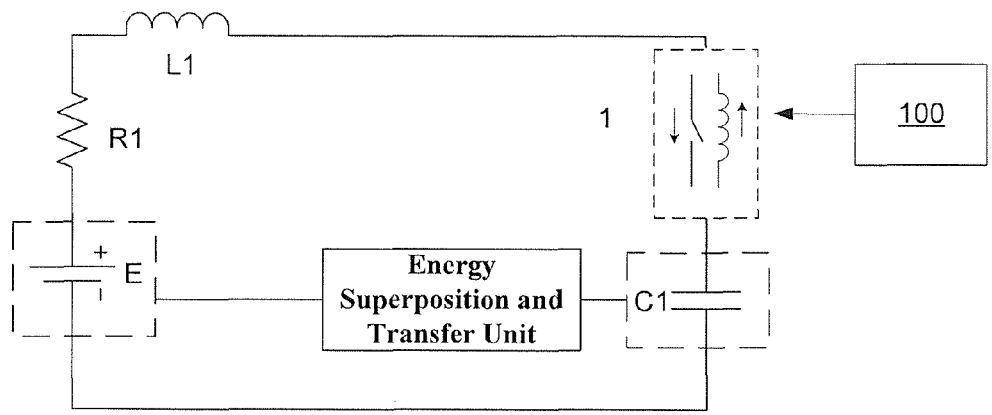
FIG. 14 is a schematic diagram showing a battery heating circuit including an energy limiting circuit and an energy superposition and transfer unit according to yet another embodiment of the present invention.

In order to improve the working efficiency of the heating circuit while achieve energy recycling for the energy storage circuit, in one embodiment of the present application, as shown in FIG. 14, the heating circuit of the present application may comprises an energy superposition and transfer unit, the energy superposition and transfer unit is connected with the energy storage circuit, and is configured to transfer the energy in the energy storage circuit to an energy storage component after the switch unit 1 switches on and then switches off, and then superpose the remaining energy in the energy storage circuit with the energy in the battery E. Through energy transfer, energy recycling is achieved, and through energy superposition, the discharging current in the heating loop will be increased when the switch unit 1 switches on again, and thereby the working efficiency of the heating circuit can be improved.

The superposition of the remaining energy in the energy storage circuit with the energy in the battery can be implemented by inverting the voltage polarity of the charge storage component C1; after polarity inversion, the voltage across the charge storage component C1 can be added in series with the voltage of the battery E; thus, when the switch unit 1 switches on at the next time, the energy in the battery E can be superposed with the energy in the charge storage component C1.

Figure 15:
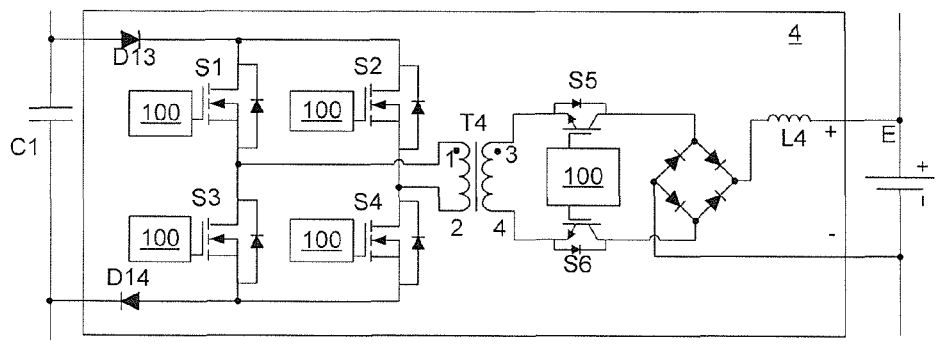
FIG. 15 is a schematic diagram showing the energy superposition and transfer unit as part of the battery heating circuit as shown in FIG. 14 according to one embodiment of the present invention.

Therefore, according to one embodiment of the present invention, as shown in FIG. 15, in the heating circuit, the energy superposition and transfer unit comprises a DC-DC module 4, which is connected with the charge storage component C1 and the battery E respectively; the switching control module 100 is also connected with the DC-DC module 4, and is configured to transfer the energy in the charge storage component C1 to an energy storage component by controlling the operation of the DC-DC module 4, and then superpose the remaining energy in the charge storage component C1 with the energy in the battery E. In that embodiment, the energy storage component is the battery E.

The DC-DC module 4 is a DC-DC (direct current to direct current) conversion circuit for energy transfer and voltage polarity inversion commonly used in the field. Certain embodiments of the present invention does not impose any limitation to the specific circuit structure of the DC-DC module 4, as long as the module can accomplish energy transfer from the charge storage component C1 and voltage polarity inversion of the charge storage component C1 according to some embodiments. Those skilled in the art can add, substitute, or delete the components in the circuit as needed.

In one embodiment of the DC-DC module 4, as shown in FIG. 15, the DC-DC module 4 comprises: a two-way switch S1, a two-way switch S2, a two-way switch S3, a two-way switch S4, a two-way switch S5, a two-way switch S6, a fourth transformer T4, a one-way semiconductor component D13, a one-way semiconductor component D14, a current storage component L4, and four one-way semiconductor components. In that embodiment, the two-way switch S1, two-way switch S2, two-way switch S3, and two-way switch S4 are MOSFETs, while the two-way switch S5 and two-way switch S6 are IGBTs.

Wherein: the pin 1 and pin 3 of the fourth transformer T3 are dotted terminals; the negative electrodes of two one-way semiconductor components among the four one-way semiconductor components are connected into a group and their junction point is connected with the positive pole of the battery E through the current storage component L4; the positive electrodes of the other two one-way semiconductor components are connected into a group and their junction point is connected with the negative pole of the battery E; in addition, the junction points between the groups are connected with pin 3 and pin 4 of the third transformer T3 via two-way switch S5 and two-way switch S6 respectively, and thereby form a bridge rectifier circuit.

Wherein: the source electrode of the two-way switch S1 is connected with the drain electrode of the two-way switch S3, the source electrode of the two-way switch S2 is connected with the drain electrode of the two-way switch S4, the drain electrodes of the two-way switch S1 and two-way switch S2 are connected with the positive end of the charge storage component C1 via the one-way semiconductor component D13, the source electrodes of the two-way switch S3 and two-way switch S4 are connected with the negative end of the charge storage component C1 via the one-way semiconductor component D14; thus, a full-bridge circuit is formed.

In the full-bridge circuit, the two-way switch S1 and two-way switch S2 constitute the upper bridge arm, and the two-way switch S3 and two-way switch S4 constitute the lower bridge arm; the pin 1 of the fourth transformer T4 is connected with the node between two-way switch S1 and two-way switch S3, and the pin 2 of the fourth transformer T4 is connected with the node between two-way switch S2 and two-way switch S4.

Wherein: the two-way switch S1, two-way switch S2, two-way switch S3, and two-way switch S4, two-way switch S5, and two-way switch S6 are controlled by the switching control module 100 respectively to switch on and switch off.

Hereafter the working process of the DC-DC module 4 will be described:

1. After the switch unit 1 switches off, when electricity recharging is to be performed from the charge storage component C1 (i.e., transferring the energy from the charge storage component C1 back to the battery E) so as to accomplish energy transfer, the switching control module 100 controls the two-way switch S5 and S6 to switch on, and controls the two-way switch S1 and two-way switch S4 to switch on at the same time, to constitute phase A; the switching control module 100 controls the two-way switch S2 and two-way switch S3 to switch on at the same time, to constitute phase B. Thus, by controlling the phase A and phase B to switch on alternately, a full-bridge circuit is formed;

2. When the full-bridge circuit operates, the energy in charge storage component C1 is transferred to the battery E through the fourth transformer T4 and rectifier circuit; the rectifier circuit converts the AC input into DC and outputs the DC to the battery E, to attain the purpose of electricity recharging;

3. When polarity inversion of the charge storage component C1 is to be performed to accomplish energy superposition, the switching control module 100 controls the two-way switch S5 and two-way switch S6 to switch off, and controls either of the two groups (two-way switch S1 and two-way switch S4, or two-way switch S2 and two-way switch S3) to switch on; now, the energy in the charge storage component C1 flows through the positive end of charge storage component C1, two-way switch S1, primary side of the fourth transformer T4, and two-way switch S4 back to the negative end of the charge storage component C1, or flows through the positive end of charge storage component C1, two-way switch S2, primary side of the fourth transformer T4, and two-way switch S3 back to the negative end of the charge storage component C1. Thus, the purpose of voltage polarity inversion of charge storage component C1 is attained by using the magnetizing inductance at the primary side of T4.

In another embodiment, in the heating circuit provided in the present invention, the energy superposition and transfer unit can comprise an energy superposition unit and an energy transfer unit, wherein: the energy transfer unit is connected with the energy storage circuit, and is configured to transfer the energy in the energy storage circuit to an energy storage component after the switch unit 1 switches on and then switches off; the energy superposition unit is connected with the energy storage circuit, and is configured to superpose the remaining energy in the energy storage circuit with the energy in the battery E after the energy transfer unit performs energy transfer.

Wherein: the energy superposition unit and the energy transfer unit can be the energy superposition unit and the energy transfer unit provided in certain embodiments of the present invention described above, for the purpose of transferring and superposing the energy in the charge storage component C1. The structure and function of the energy superposition unit and the energy transfer unit will not be detailed further here.

Figure 16:
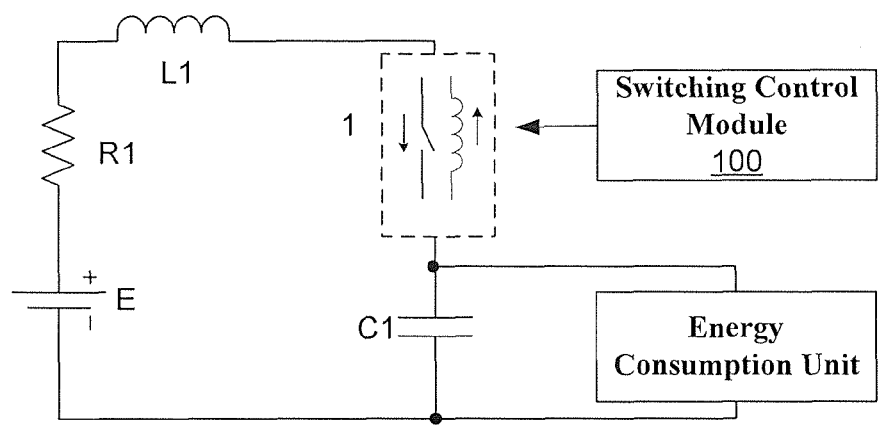
FIG. 16 is a schematic diagram showing a battery heating circuit including an energy limiting circuit and an energy consumption unit according to yet another embodiment of the present invention.

In one embodiment of the present invention, the improvement of working efficiency of the heating circuit could be achieved by consuming the energy in the charge storage component C1. Thus, as shown in FIG. 16, the heating circuit further comprises an energy consumption unit, which is connected with the charge storage component C1, and is configured to consume the energy in the charge storage component C1 after the switch unit 1 switches on and then switches off.

The energy consumption unit can be used separately in the heating circuit, to consume the energy in the charge storage component C1 directly after the switch unit 1 switches on and then switches off; or, it can be integrated into the embodiments described above, for example, it can be integrated into the heating circuit that comprises an energy superposition unit, so as to consume the energy in the charge storage component C1 after the switch unit 1 switches on and then switches off and before the energy superposition unit performs energy superposition; or, it can be integrated into the heating circuit that comprises an energy transfer unit, so as to consume the energy in the charge storage component C1 after the switch unit 1 switches on and then switches off and before or after the energy transfer unit performs energy transfer; likewise, it can be integrated into the heating circuit that comprises an energy superposition and transfer unit, so as to consume the energy in the charge storage component C1 after the switch unit 1 switches on and then switches off and before the energy superposition and transfer unit performs energy transfer, or consume the energy in the charge storage component C1 after the switch unit 1 switches on and then switches off and after the energy superposition and transfer unit performs energy transfer and before the energy superposition and transfer unit performs energy superposition; certain embodiments of the present invention do not impose any limitation to the specific implementation of the energy consumption unit according to some embodiments. Moreover, the working process of the energy consumption unit can be understood more clearly in the following embodiments.

Figure 17:
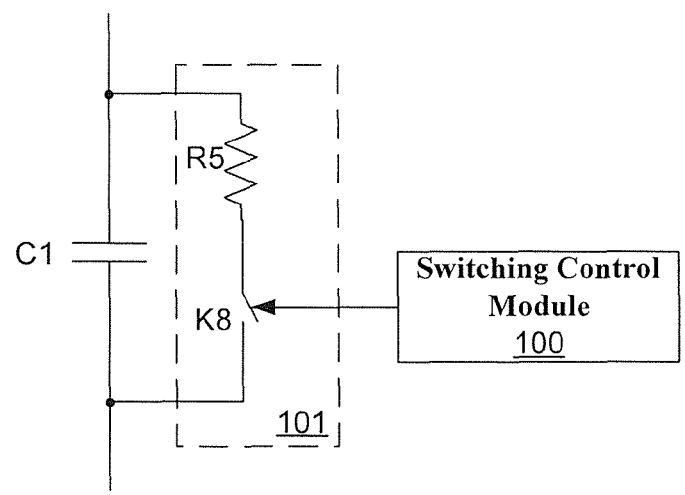
FIG. 17 is a schematic diagram showing the energy consumption unit as part of the battery heating circuit as shown in FIG. 16 according to one embodiment of the present invention.

In one embodiment, as shown in FIG. 17, the energy consumption unit comprises a voltage control unit 101, which is configured to convert the voltage across the charge storage component C1 to a predetermined value of voltage after the switch unit 1 switches on and then switches off. The predetermined value of voltage can be set as needed.

In one embodiment of the present invention, as shown in FIG. 17, the voltage control unit 101 comprises a damping component R5 and a switch K8, wherein: the damping component R5 and switch K8 are connected with each other in series, and then connected in parallel across the charge storage component C1; the switching control module 100 is also connected with the switch K8, and is configured to control the switch K8 to switch on after the switch unit 1 switches on and then switches off. Thus, the energy in the charge storage component C1 can be consumed across the damping component R5.

Figure 18:
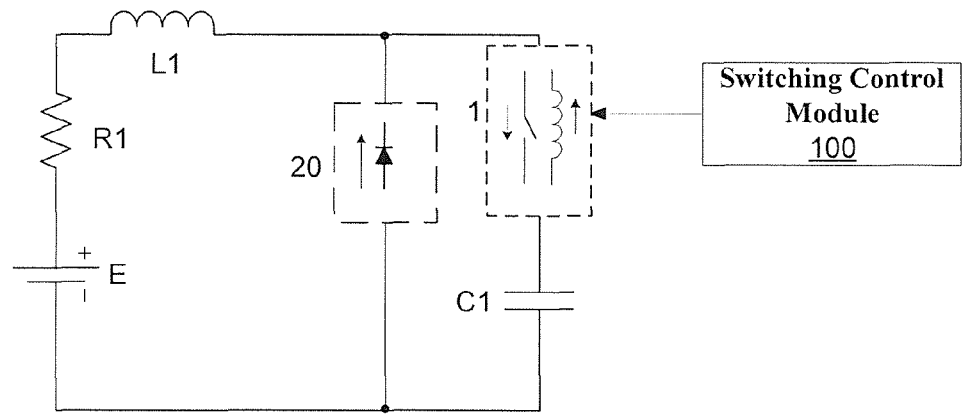
FIG. 18 is a schematic diagram showing a battery heating circuit including an energy limiting circuit and a freewheeling circuit according to yet another embodiment of the present invention.
Figure 19:
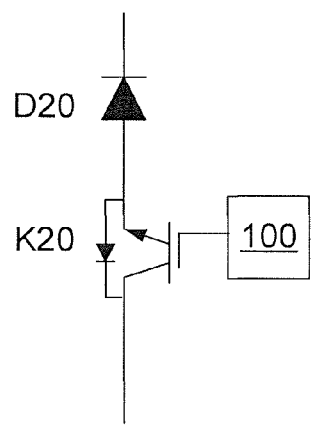
FIG. 19 is a schematic diagram showing the freewheeling circuit as part of the battery heating circuit according to one embodiment of the present invention.

Due to the existence of the current storage component, high induced electromotive force may be generated in the inductive components such as current storage components L1 and L11 because the sudden change of current to zero if the switch unit switches off when there is current flowing from the energy storage circuit to the battery, and the high induced electromotive force may damage other circuit components such as switch unit 1 in the circuit. In view of above problem, preferably, as shown in FIG. 18, the heating circuit for battery E provided in one embodiment of the present invention further comprises a freewheeling circuit 20, which starts operation when the switch unit 1 switches off during current flowing from the energy storage circuit to the battery E, so as to protect other circuit components in the circuit. As shown in FIG. 19, the freewheeling circuit 20 can comprise a switch K20 and a one-way semiconductor component D20 connected in series with each other; the switching control module 100 is connected with the switch K20, and is configured to control the switch K20 to switch on after the switch unit 1 switches off when there is current flowing from the energy storage circuit to the battery, and control the switch K20 to switch off when the current flowing from the energy storage circuit to the battery reaches a predetermined current value. One end of the freewheeling circuit 20 can be connected between the current storage component L1 and the switch unit 1, and the other end of the freewheeling circuit 20 can be connected to the negative electrode of the battery. Since the heating circuit provided in certain embodiments of the present invention has a current storage component L11 that limits the energy in the second one-way branch of the switch unit 1, besides the current storage component L1 in the main loop, preferably, one end of the freewheeling circuit 20 is connected to the negative electrode of the battery, and the other end of the freewheeling circuit 20 is connected to the second one-way branch, so that the freewheeling current flows through the current storage component L11. For example, in one embodiment that utilizes the switch unit 1 shown in FIG. 2, one end of the freewheeling circuit 20 is connected between the one-way semiconductor component D12 and the current storage component L11, and the other end of the freewheeling circuit 20 is connected to the negative electrode of the battery E; in one embodiment that utilizes the switch unit 1 shown in FIG. 3, one end of the freewheeling circuit 20 is connected between the switch K7 and the current storage component L11, and the other end of the freewheeling circuit 20 is connected to the negative electrode of the battery E, so that better current freewheeling effect is attained.

Figure 25:
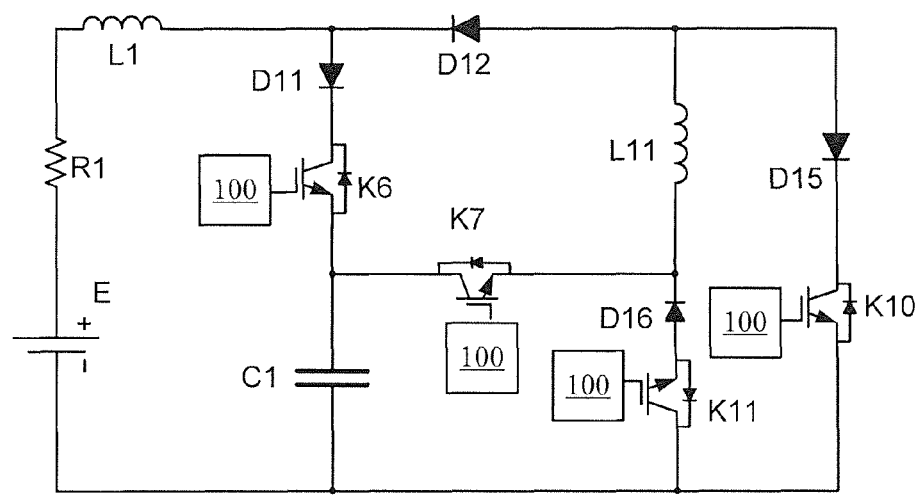
FIG. 25 is a schematic diagram showing a battery heating circuit including an energy limiting circuit according to yet another embodiment of the present invention.

In order to reduce the number of components/components and reduce the size of the heating circuit, one embodiment is further provided in the present invention, so that the current storage component L11 for energy limitation can also be used in the polarity inversion unit 102, to take a role in the voltage polarity inversion of the charge storage component C1. In the embodiment, as shown in FIG. 25, the switch unit 1 can be in the form of the switch unit shown in FIG. 5, and the current storage component L11 for energy limitation is connected in series between the one-way semiconductor component D12 and the switch K7 in the second one-way branch of the switch unit 1; the heating circuit further comprises a one-way semiconductor component D15, a one-way semiconductor component D16, a switch K10, and a switch K11; the negative electrode of the one-way semiconductor component D16 is connected between the switch K7 and the charge storage component L11, the positive electrode of the one-way semiconductor component D16 is connected to one end of the switch K11, and the other end of the switch K11 is connected to the negative electrode of the battery; the positive electrode of the one-way semiconductor component D15 is connected between the one-way semiconductor component D12 and the charge storage component L11, the negative electrode of the one-way semiconductor component D15 is connected to one end of the switch K10, and the other end of the switch K10 is connected to the negative electrode of the battery; the switching control module 100 is also connected with the switch K10 and switch K11, and is configured to control ON/OFF of the switch K10 and switch K11.

In the embodiment, the switching control module 100 can control the switches K6, K7, K10, and K11 with a variety of ON/OFF strategies, as long as the energy can flow between the battery E and the charge storage component C1 and the voltage across the charge storage component C1 can be inverted. For example, in one embodiment, when the battery is to be heated, the switching control module 100 controls the switch K6 and switch K7 to switch on, so that the energy flows from the battery to the charge storage component C1, and then flows from the charge storage component C1 back to the battery (wherein: the switch K6 and switch K7 can be controlled to switch on at the same time, or the switch K7 can be controlled to switch on after the switch K6 switches on); when the voltage across the charge storage component C1 reaches a first preset value which is higher than the voltage of the battery, the switch K7 switches off and the switch K11 switches on; when the current flowing through the current storage component L11 is zero, the switch K11 switches off, and the switch K7 and switch K10 switch on, so that the voltage polarity of the charge storage component C1 is inverted. For example, in another embodiment, when the battery is to be heated, the switching control module 100 controls the switch K6 and switch K7 to switch on, so that the energy flows from the battery to the charge storage component C1, and then flows from the charge storage component C1 back to the battery; when the voltage across the charge storage component C1 reaches a second preset value which is lower than or equal to the voltage of the battery, the switch K7 switches off, and the switch K11 switches on; when the current flowing through the current storage component L11 reaches a second set value of current, the switch K11 switches off, and the switch K7 and switch K10 switch on; when the current flowing through the current storage component L11 reaches a first set value of current, the switch K10 switches off, so that the energy in the current storage component L11 flows to the battery; when the current flowing through the current storage component L11 is zero, the switch K7 and switch K10 switch on, so that the voltage polarity of the charge storage component C1 is inverted.

The switching control module 100 can be a separate controller, which, by using internal program setting, enables ON/OFF control of different external switches; or, the switching control module 100 can be a plurality of controllers, for example, a switching control module 100 can be set for each external switch correspondingly; or, the plurality of switching control modules 100 can be integrated into an assembly. Certain embodiments of the present invention do not impose any limitation to the forms of implementation of the switching control module 100.

Figure 20:
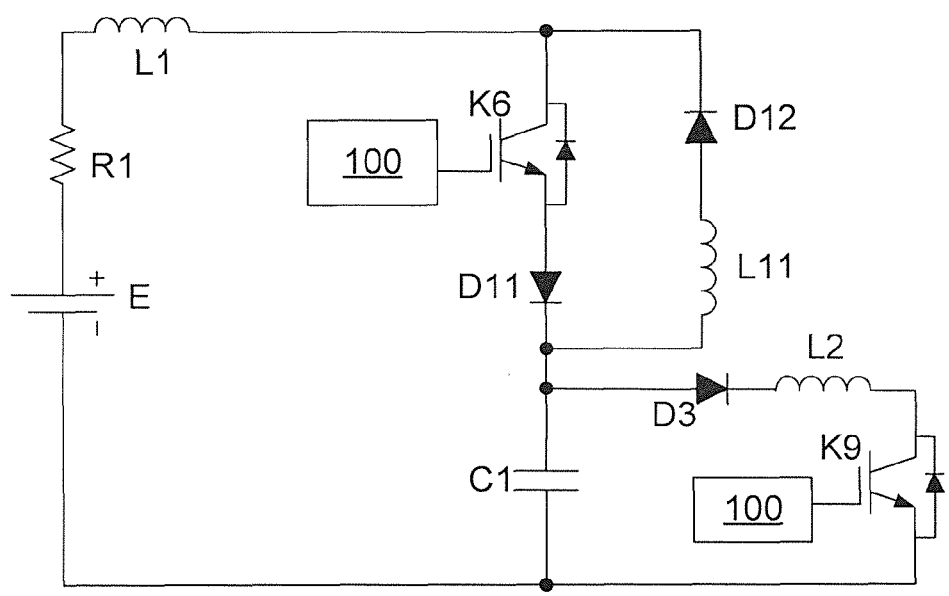
FIG. 20 is a schematic diagram showing a battery heating circuit including an energy limiting circuit according to yet another embodiment of the present invention.
Figure 21:
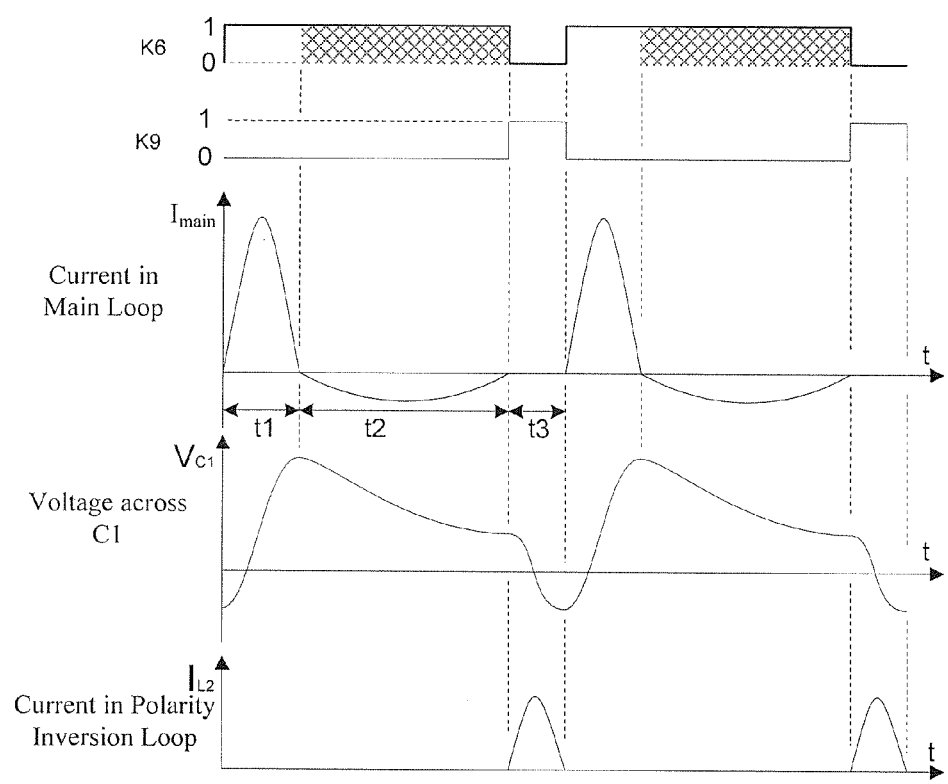
FIG. 21 is a timing diagram of waveforms of the battery heating circuit as shown in FIG. 20 according to one embodiment of the present invention.
Figure 22:
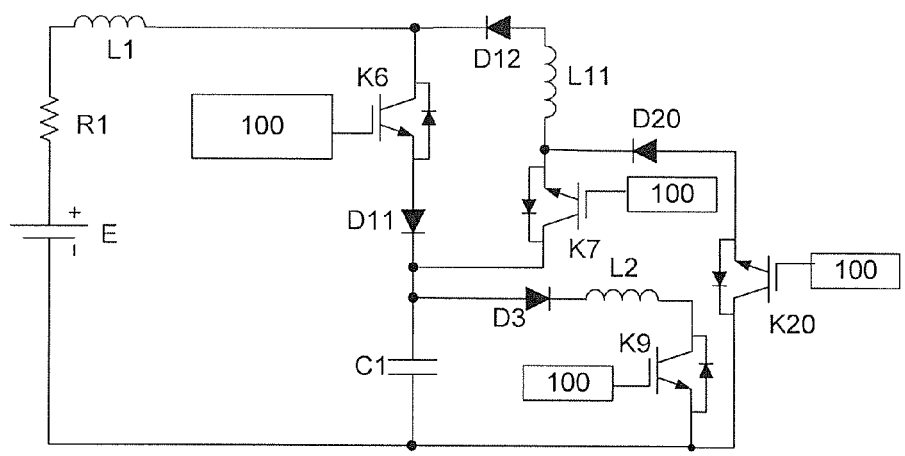
FIG. 22 is a schematic diagram showing a battery heating circuit including an energy limiting circuit according to yet another embodiment of the present invention.

According to certain embodiments, the working process of the heating circuit for battery E is introduced briefly below with reference to FIGS. 20-29, wherein: FIGS. 20, 22, and 25 show different embodiments of the heating circuit for battery E, and FIGS. 21, 23 and 24, FIG. 26, and FIG. 29 show corresponding waveforms. It should be noted: though the features and components are described specifically with reference to FIGS. 20, 22, and 25, each feature or component can be used separately without other features and components, or can be used in combination or not in combination with other features and components. The embodiments of the heating circuit for battery E are not limited to those as shown in FIGS. 20, 22, and 25. The grid parts of the waveforms as shown in FIGS. 21, 23, 24, 26 and 29 indicate drive pulses can be applied to the switch one or more times within the period, and the pulse width can be adjusted as needed.

For example, in the heating circuit for battery E as shown in FIG. 20, the switch K6 and the one-way semiconductor component D11 are connected in series to constitute a first one-way branch of the switch unit; the one-way semiconductor component D12 constitutes the second one-way branch of the switch unit 1; the current storage component L11 is arranged as an energy limiting circuit in the second one-way branch, and is connected in series with the one-way semiconductor component D12; the one-way semiconductor component D3, the current storage component L2, and the switch K9 constitute a polarity inversion unit 102; the switching control module 100 can control ON/OFF of the switches K9 and K6. FIG. 21 shows the waveforms of the current $I_{main}$ in the main loop of the heating circuit as shown in FIG. 20, the voltage $V_{C1}$ across C1, and the current $I_{L2}$ in the polarity inversion loop. In another example, the working process of the heating circuit as shown in FIG. 20 is as follows:

a) The switching control module 100 controls the switch K6 to switch on, and therefore the battery E discharges in forward direction through the switch K6, the one-way semiconductor component D11, and the charge storage component C1 (as indicated by the time period t1 as shown in FIG. 2), and is charged in reverse direction through the current storage component L11 and the one-way semiconductor component D12 (as indicated by the time period t2 as shown in FIG. 21); it is seen from the time period t2 in FIG. 21, due to the existence of the current storage component L11, the current in the main loop is limited at a smaller value when the battery is charged according to some embodiments.

b) The switching control module 100 controls the switch K6 to switch off when the current in reverse direction is zero.

c) The switching control module 100 controls the switch K9 to switch on, and therefore the polarity inversion unit 102 starts operation; the charge storage component C1 discharges through the circuit composed by the one-way semiconductor component D3, the current storage component L2, and the switch K9, to achieve the purpose of voltage polarity inversion; then, the switching control module 100 controls the switch K9 to switch off, as indicated by the time period t3 as shown in FIG. 21.

d) Repeat step a) through step c); the battery E is heated up continuously while it is discharged and is charged, till the battery E meets the heating stop condition.

Figure 23:
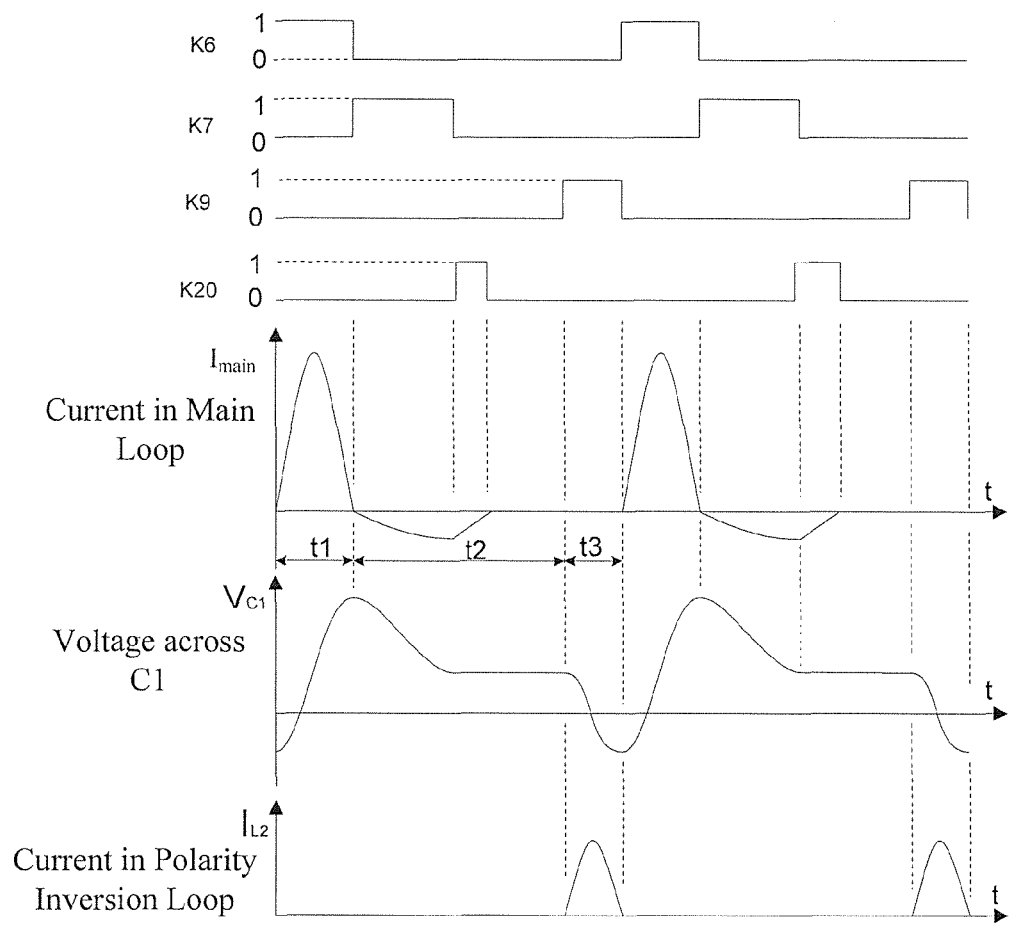
FIG. 23 is a timing diagram of waveforms of the battery heating circuit as shown in FIG. 22 according to one embodiment of the present invention.
Figure 24:
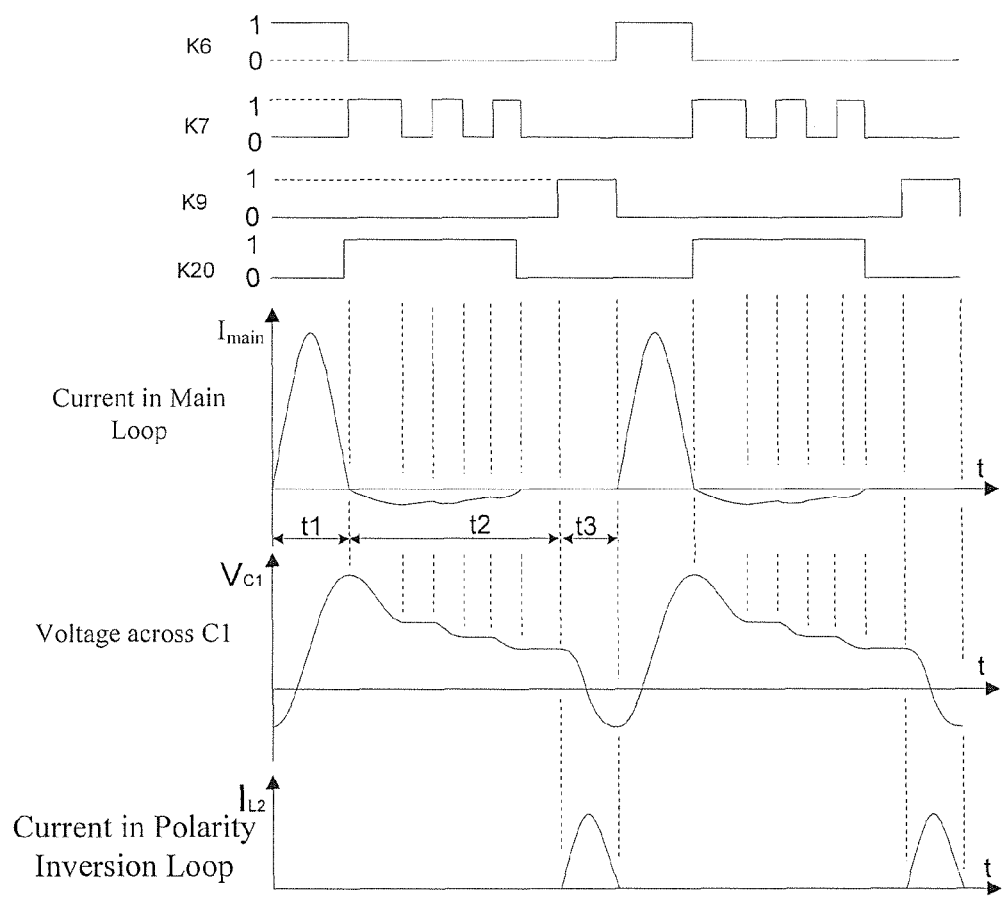
FIG. 24 is a timing diagram of waveforms of the battery heating circuit as shown in FIG. 22 according to another embodiment of the present invention.

For example, in the heating circuit for battery E as shown in FIG. 22, the switch K6 and the one-way semiconductor component D11 are connected in series to constitute a first one-way branch of the switch unit 1; the one-way semiconductor component D12 and the switch K7 constitute the second one-way branch for the switch unit 1; the current storage component L11 is connected in series between the one-way semiconductor component D12 and the switch K7, to achieve the purpose of current limitation; the one-way semiconductor component D3; the one-way semiconductor component D20 and the switch K20 are connected in series to constitute a freewheeling circuit, one end of the freewheeling circuit is connected between the current storage component L11 and the switch K7 in the second one-way branch, and the other end of the freewheeling circuit is connected to the negative electrode of the battery; the switching control module 100 can control ON/OFF of the switch K6, the switch K7, the switch K9, and the switch K20. FIG. 23 and FIG. 24 show the waveforms of the current $I_{main}$ in the main loop, the voltage $V_{C1}$ across C1, and the current $I_{L2}$ of the polarity inversion loop; in a cycle as shown in FIG. 23, the switch K7 switches on and switches off once; when the switch K7 switches off, the diode D20 sustains the current once; in the reversed charging process of battery E in a cycle in FIG. 24, the switch K7 is controlled to switch on and switch off in multiple times, and the current is sustained from the diode D20 whenever the switch K7 switches off. In another example, the working process of the heating circuit as shown in FIG. 22 is as follows:

a) The switching control module 100 controls the switch K6 to switch on, and thus the battery E is discharged in forward direction through the switch K6 and the one-way semiconductor component D11, and charges the storage component C1 (as indicated by the time period t1 as shown in FIG. 23 and FIG. 24); when the discharging in the forward direction is completed, the switching control module 100 controls the switch K7 to switch on (as shown in FIG. 23), or controls the switch K7 to switch on and switch off for several times (as shown in FIG. 24); the charge storage component C1 charges the battery E in reverse direction through the switch K7, the current storage component L11, and the one-way semiconductor component D12 (as indicated by the time period t2 in FIGS. 23 and 24); due to the existence of the current storage component L11, the amplitude of current flowing to battery E is limited; the switching control module 100 controls the switch K20 to switch on, so that the diode D20 takes an role for current freewheeling when the switch K7 switches off, as indicated by the time period t2 in FIG. 23 and FIG. 24;

b) The switching control module 100 controls the switch K7 and the switch K20 to switch off when the current in reverse direction reaches the predetermined current value (e.g., zero);

c) The switching control module 100 controls the switch K9 to switch on, and therefore the polarity inversion unit 102 starts operation; the charge storage component C1 discharges through the loop composed by the one-way semiconductor component D3, the current storage component L2, and the switch K9, to achieve the purpose of voltage polarity inversion of the charge storage component C1; then, the switching control module 100 controls the switch K9 to switch off, as indicated by the time period t3 as shown in FIG. 23 and FIG. 24;

d) Repeat step a) through step c); the battery E is heated up continuously while it is discharged and is charged, till the battery E meets the heating stop condition.

Figure 26:
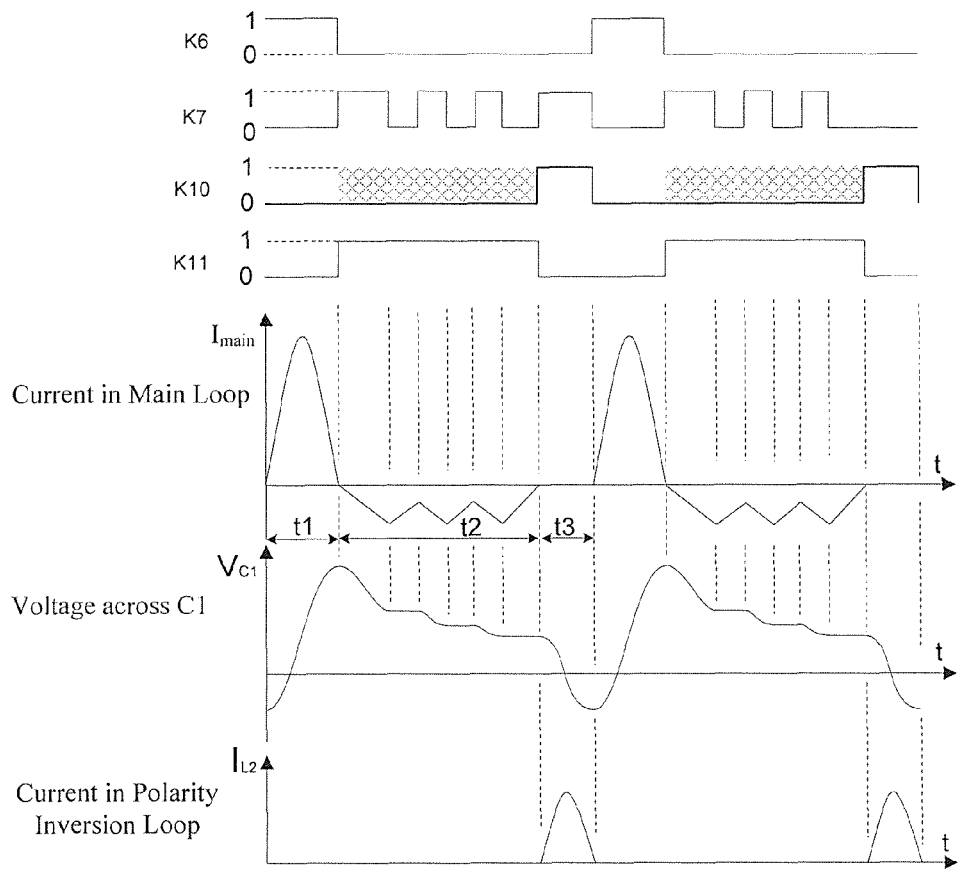
FIG. 26 is a timing diagram of waveforms of the battery heating circuit as shown in FIG. 25 according to one embodiment of the present invention.
Figure 27:
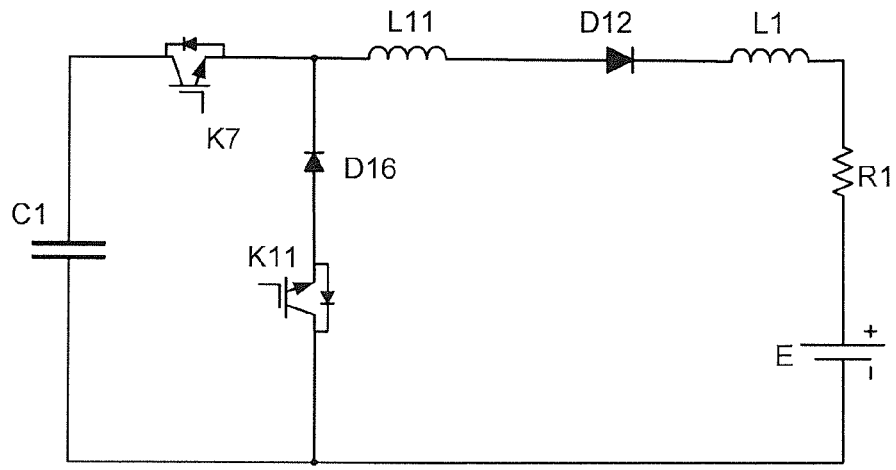
FIG. 27 is an equivalent circuit for the battery heating circuit as shown in FIG. 25 when the battery is charged in reverse direction according to one embodiment.
Figure 28:
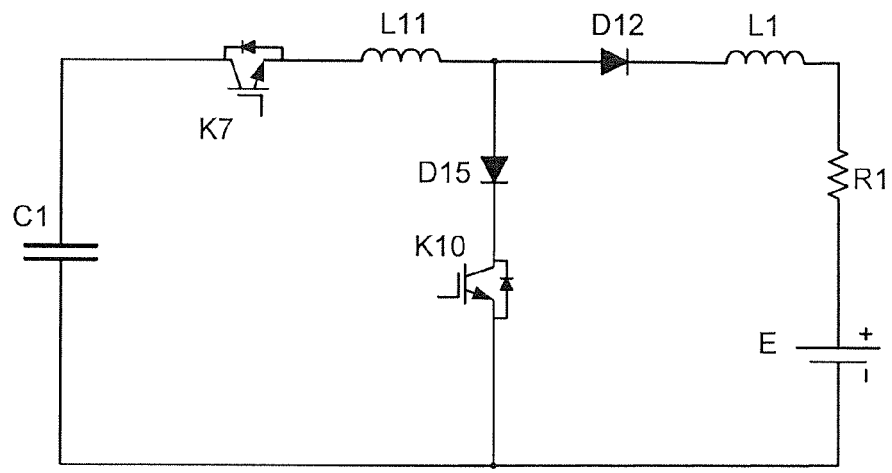
FIG. 28 is an equivalent circuit for the battery heating circuit as shown in FIG. 25 when the battery is charged in reverse direction according to another embodiment.

For example, in the heating circuit as shown in FIG. 25, the switch K6 and the one-way semiconductor component D11 are connected in series with each other to constitute the first one-way branch of the switch unit 1; the one-way semiconductor component D12 and the switch K7 constitute the second one-way branch of the switch unit 1; the current storage component L11 is connected in series between the one-way semiconductor component D12 and the switch K7 to provide current limiting function; the branch composed of the switch K11 and the one-way semiconductor component D16 provides current freewheeling function; the switch K7, the current storage component L11, the one-way semiconductor component D15, the switch K10, and the charge storage component C1 constitute the polarity inversion loop for the charge storage component FIG. 26 shows waveforms of the current $I_{main}$ in the main loop, the voltage $V_{C1}$ across and the current $I_{L2}$ in the polarity inversion circuit in the heating circuit as shown in FIG. 25. For the convenience of understanding, FIG. 27 and FIG. 28 provide equivalent circuit diagrams in the back-charging process. In another example, hereunder an operating process of the heating circuit as shown in FIG. 25 is introduced, with reference to FIG. 26:

a) The switching control module 100 controls the switch K6 to switch on, and thus the battery E is discharged in forward direction (as indicated by the time period t1 as shown in FIG. 26);

b) At the end of the discharging process in forward direction, the switching control module 100 controls the switch K6 to switch off, and controls the switch K7 to switch on; thus, the charge storage component C1 charges the battery E in reverse direction through the switch K7, the current storage component L11, and the one-way semiconductor component D12 (as indicated by the time period t2 as shown in FIG. 26); in the process of reversed charging of battery E, the switch K7 can be controlled to switch on and switch off time after time, to reduce the current flowing to the battery E, as indicated by the time period t2 as shown in FIG. 26; in addition, the switch K11 is controlled to switch on in the reversed charging process, or the switch K11 is controlled to switch on after the switch K7 switches off when there is current flowing to the battery, so that the one-way semiconductor component D16 achieves the current freewheeling function.

c) When the voltage across the charge storage component C1 reaches the first preset value of voltage (e.g., higher than the voltage of the battery), the switching control module 100 controls the switch K7 to switch off, and controls the switch K11 to switch on, so as to achieve the current freewheeling function; when the current flowing through the current storage component L11 is zero, the switch K11 is controlled to switch off, and the switch K7 and K10 are controlled to switch on, and thus the charge storage component C1 discharges through the switch K7, the current storage component L11, the one-way semiconductor component D15, and the switch K10, and achieve the purpose of voltage polarity inversion of the charge storage component C1; then, the switching control module 100 controls the switch K7 and K10 to switch off, as indicated by the time period t3 as shown in FIG. 26;

d) Repeat step a) through step c); the battery E is heated up continuously while it is discharged and is charged, till the battery E meets the heating stop condition.

Figure 29:
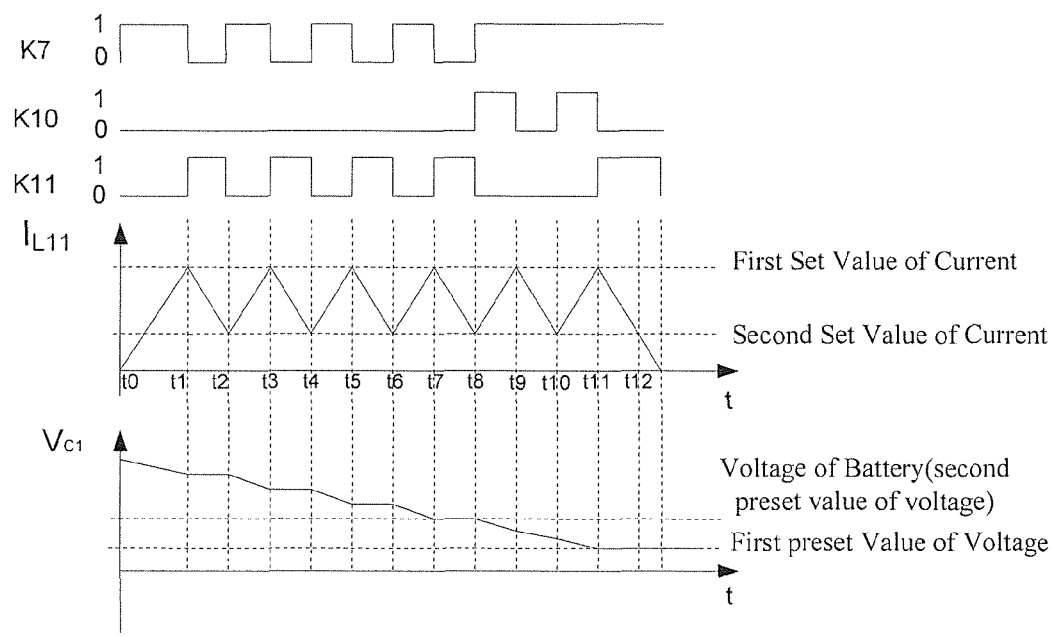
FIG. 29 is a timing diagram of waveforms of the battery heating circuit as shown in FIG. 25 according to another embodiment of the present invention.

In yet another example, another operating process of the heating circuit as shown in FIG. 25 is introduced, with reference to FIG. 29:

a) The switching control module 100 controls the switch K6 to switch on, and thus the battery E is discharged in forward direction (as indicated by the time period t1 as shown in FIG. 29);

At the end of the discharging process in forward direction, the switching control module 100 controls the switch K6 to switch off, and controls the switch K7 to switch on and switch off time after time; the charge storage component C1 charges the battery E in reverse direction through the switch K7, the current storage component L11, and the one-way semiconductor component D12 (as indicated by the time period t0-t8 as shown in FIG. 29); in addition, the switch K11 is controlled to switch on in the reversed charging process, or the switch K11 is controlled to switch on after the switch K7 switches off when there is current flowing to the battery, so that the one-way semiconductor component D16 achieves the current freewheeling function. For example, at time t0, the switch K7 switches on, the charge storage component C1 charges the battery E through K7, L11, and D12, and stores energy in the current storage component L11 at the same time; when the current in the current storage component L11 rises to the first set value of current, as indicated by the time t1 as shown in FIG. 29, the switch K7 switches off, and the switch K11 switches on at the same time (e.g., K11 can be in ON state before K7 switches off, till the back-charge process completes), and thus the inductor sustains the current flowing through the switch K11 and the one-way semiconductor component D16; when the current in the current storage component L11 drops to the second set value of current, as indicated by the time t2 as shown in FIG. 29, the switch K7 switches on again, and the next back-charge cycle starts.

c) When the voltage across the charge storage component C1 drops to the second preset value of voltage (lower than or equal to the voltage of the battery, as shown in FIG. 29, where the second preset value is equal to the voltage of the battery), the switching control module 100 controls the switch K7 to switch off, and controls the switch K11 to switch on, to achieve the current freewheeling function; when the current flowing through the current storage component L11 reaches the second set value of current, the switch K11 is controlled to switch off, while the switch K7 and K10 are controlled to switch on; now, the equivalent circuit is shown in FIG. 28, and the waveform is shown in the time period t8-t12 in FIG. 29; the circuit composed of the one-way semiconductor component D15, the switch K7, the current storage component L11, the one-way semiconductor component D12, and the switch K10 transfers the energy in the charge storage component C1 back to the battery E, and then inverts the voltage polarity of the charge storage component C1. At time t8, the switches K7 and K10 switch on at the same time, the charge storage component C1 stores energy in the current storage component L11 through the switch K7, the one-way semiconductor component D15, and the switch K10; when the current in the current storage component L11 rises to the first set value of current, as indicated by the time t9 as shown in FIG. 29, the switch K10 switches off, and the current storage component L11 sustains the current through the switch K7 and the one-way semiconductor component D12; when the current flowing through the current storage component L11 drops to the second set value of current, as indicated by the time t10 as shown in FIG. 29, the switch K10 switches on again, and the next back-charge cycle starts, till the voltage of the capacitor reaches a first preset value of voltage. When the current flowing through the current storage component L11 is zero, the switches K7 and K10 switch on, so that the voltage polarity of the charge storage component C1 is inverted;

d) Repeat step a) through step c); the battery E is heated up continuously while it is discharged and is charged, till the battery E meets the heating stop condition.

The heating circuit provided in some embodiments of the present invention can improve the charge/discharge performance of the battery; in addition, for example, since the energy storage circuit is connected with the battery in series in the heating circuit, safety problem caused by over-current that results from short circuit and failure of the switch unit can be avoided when the battery is heated due to the existence of the charge storage components C1 connected in series, and therefore the battery can be protected effectively.

According to one embodiment, a battery heating circuit comprises a switch unit 1, a switching control module 100, a damping component R1, an energy storage circuit, and an energy limiting circuit, wherein: the energy storage circuit is connected with the battery and comprises a current storage component L1 and a charge storage component C1; the damping component R1, the switch unit 1, the current storage component L1, and the charge storage component C1 are connected in series; the switching control module 100 is connected with the switch unit 1, and is configured to control ON/OFF of the switch unit 1, so that the energy can flow back-and-forth between the battery and the energy storage circuit when the switch unit 1 switches on; the energy limiting circuit is configured to limit the magnitude of current flowing from the energy storage circuit to the battery.

For example, wherein: the switch unit 1 comprises a first one-way branch configured to enable energy flow from the battery to the energy storage circuit and a second one-way branch configured to enable energy flow from the energy storage circuit to the battery; the switching control module 100 is connected to either or both of the first one-way branch and the second one-way branch, and is configured to control ON/OFF of the switch unit 1 by controlling ON/OFF of the connected branch(es). In another example, wherein: the energy limiting circuit comprises a current storage component L11, which is connected in series with the second one-way branch. In yet another example, wherein: the switch unit 1 comprises a switch K6, a one-way semiconductor component D11, and a one-way semiconductor component D12; the switch K6 and the one-way semiconductor component D11 are connected with each other in series to constitute the first one-way branch; the one-way semiconductor component D12 constitutes the second one-way branch; the switching control module 100 is connected with the switch K6 and is configured to control ON/OFF of the first one-way branch by controlling ON/OFF of the switch K6. In yet another example, wherein: the switch unit 1 further comprises a switch K7 in the second one-way branch, and the switch K7 is connected with the one-way semiconductor component D12 in series; the switching control module 100 is further connected with the switch K7 and is configured to control ON/OFF of the second one-way branch by controlling ON/OFF of the switch K7.

In yet another example, wherein: the heating circuit further comprises a one-way semiconductor component D15, a one-way semiconductor component D16, a switch K10, and a switch K11; the negative electrode of the one-way semiconductor component D16 is connected between the switch K7 and the charge storage component L11, the positive electrode of the one-way semiconductor component D16 is connected to one end of the switch K11, and the other end of the switch K11 is connected to the negative electrode of the battery; the positive electrode of the one-way semiconductor component D15 is connected between the one-way semiconductor component D12 and the charge storage component L11, and the negative electrode of the one-way semiconductor component D15 is connected to one end of the switch K10, and the other end of the switch K10 is connected to the negative electrode of the battery; the switching control module 100 is also connected with the switch K10 and the switch K11 respectively, to control ON/OFF of the switch K10 and the switch K11. In yet another example, wherein: the switching control module 100 is configured to: control the switch K6 and the switch K7 to switch on, so that the energy can flow from the battery to the charge storage component C1 and flow from the charge storage component C1 back to the battery; control the switch K7 to switch off and control the switch K11 to switch on when the voltage across the charge storage component C1 reaches a first preset value which is higher than the voltage of the battery; control the switch K11 to switch off when the current flowing through the current storage component L11 is zero and control the switch K7 and the switch K10 to switch on, so as to invert the voltage polarity of the charge storage component C1. In yet another example, wherein: the switching control module 100 is configured to: control the switch K6 and the switch K7 to switch on, so that the energy can flow from the battery to the charge storage component C1 and flow from the charge storage component C1 back to the battery; control the switch K7 to switch off and control the switch K11 to switch on when the voltage across the charge storage component C1 reaches a second preset value which is lower than or equal to the voltage of the battery; control the switch K11 to switch off and control the switch K7 and the switch K10 to switch on when the current flowing through the current storage component L11 reaches a second set value of current; control the switch K10 to switch off when the current flowing through the current storage component L1 reaches a first set value of current, so that the energy in the current storage component L11 flows to the battery; control the switch K7 and the switch K10 to switch on when the current flowing through the current storage component L11 is zero, so as to invert the voltage polarity of the charge storage component C1.

In yet another example, wherein: the heating circuit further comprises an energy superposition unit, which is connected with the energy storage circuit, and is configured to superpose the energy in the energy storage circuit with the energy in the battery after the switching control module 100 controlling the switch unit 1 to switch on and then to switch off. In yet another example, wherein: the energy superposition unit comprises a polarity inversion unit 102, which is connected with the energy storage circuit and is configured to invert the voltage polarity of the charge storage component C1 after the switch unit 1 switches on and then switches off. In yet another example, wherein: the heating circuit further comprises an energy transfer unit, which is connected with the energy storage circuit and is configured to transfer the energy in the energy storage circuit to an energy storage component after the switch unit 1 switches on and then switches off. In yet another example, wherein: the energy storage component is the battery, and the energy transfer unit comprises an electricity recharge unit 103, which is connected with the energy storage circuit and is configured to transfer the energy in the energy storage circuit to the energy storage component after the switch unit 1 switches on and then switches off.

In yet another example, wherein: the heating circuit further comprises an energy superposition and transfer unit connected with the energy storage circuit; the energy superposition and transfer unit is configured to transfer the energy in the energy storage circuit to an energy storage component after the switch unit 1 switches on and then switches off, and then superpose the remaining energy in the energy storage circuit with the energy in the battery. In yet another example, wherein: the energy superposition and transfer unit comprises an energy superposition unit and an energy transfer unit; the energy transfer unit is connected with the energy storage circuit and is configured to transfer the energy in the energy storage circuit to an energy storage component after the switch unit 1 switches on and then switches off; the energy superposition unit is connected with the energy storage circuit and is configured to superpose the remaining energy in the energy storage circuit with the energy in the battery after the energy transfer unit performs energy transfer. In yet another example, wherein: the energy storage component is the battery, and the energy transfer unit comprises an electricity recharge unit 103, which is connected with the energy storage circuit and is configured to transfer the energy in the energy storage circuit to the energy storage component after the switch unit 1 switches on and then switches off; the energy superposition unit comprises a polarity inversion unit 102, which is connected with the energy storage circuit and is configured to invert the voltage polarity of the charge storage component C1 after the electricity recharge unit 103 performs energy transfer. In yet another example, wherein: the energy superposition and transfer unit comprises a DC-DC module 4, which is connected with the charge storage component C1 and the battery respectively; the switching control module 100 is also connected with the DC-DC module 4, and is configured to control the operation of the DC-DC module 4 to transfer the energy in the charge storage component C1 to the energy storage component, and then superpose the remaining energy in the charge storage component C1 with the energy in the battery.

In yet another example, wherein: the polarity inversion unit 102 comprises a single-pole double-throw switch J1 and a single-pole double-throw switch J2 located on the two ends of the charge storage component C1 respectively; the input wire of the single-pole double-throw switch J1 is connected within the energy storage circuit, the first output wire of the single-pole double-throw switch J1 is connected with the first pole plate of the charge storage component C1, and the second output wire of the single-pole double-throw switch J1 is connected with the second pole plate of the charge storage component C1; the input wire of the single-pole double-throw switch J2 is connected within the energy storage circuit, the first output wire of the single-pole double-throw switch J2 is connected with the second pole plate of the charge storage component C1, and the second output wire of the single-pole double-throw switch J2 is connected with the first pole plate of the charge storage component C1; the switching control module 100 is also connected with the single-pole double-throw switch J1 and the single-pole double-throw switch J2 respectively, and is configured to invert the voltage polarity of the charge storage component C1 by altering the connection relationships between the respective input wires and output wires of the single-pole double-throw switch J1 and the single-pole double-throw switch J2. In yet another example, wherein: the polarity inversion unit 102 comprises a one-way semiconductor component D3, a current storage component L2, and a switch K9; the charge storage component C1, the current storage component L2, and the switch K9 are connected sequentially in series to form a loop; the one-way semiconductor component D3 is connected in series between the charge storage component C1 and the current storage component L2 or between the current storage component L2 and the switch K9; the switching control module 100 is also connected with the switch K9 and is configured to invert the voltage polarity of the charge storage component C1 by controlling the switch K9 to switch on. In yet another example, wherein: the polarity inversion unit 102 comprises a first DC-DC module 2 and a charge storage component C2; the first DC-DC module 2 is connected with the charge storage component C1 and the charge storage component C2 respectively; the switching control module 100 is also connected with the first DC-DC module 2, and is configured to transfer the energy in the charge storage component C1 to the charge storage component C2 by controlling the operation of the first DC-DC module 2, and then transfer the energy in the charge storage component C2 back to the charge storage component C1, so as to invert the voltage polarity of the charge storage component C1. In yet another example, wherein: the electricity recharge unit 103 comprises a second DC-DC module 3, which is connected with the charge storage component C1 and the battery respectively; the switching control module 100 is also connected with the second DC-DC module 3 and is configured to transfer the energy in the charge storage component C1 to the battery by controlling the operation of the second DC-DC module 3.

In yet another example, wherein: the heating circuit further comprises an energy consumption unit, which is connected with the charge storage component C1 and configured to consume the energy in the charge storage component C1 after the switch unit 1 switches on and then switches off. In yet another example, wherein: the energy consumption unit comprises a voltage control unit 101, which is configured to convert the voltage across the charge storage component C1 to a predetermined value of voltage after the switch unit 1 switches on and then switches off. In yet another example, wherein: the heating circuit further comprises an energy consumption unit, which is connected with the charge storage component C1, and is configured to consume the energy in the charge storage component C1 after the switch unit 1 switches on and then switches off and before the energy superposition unit performs energy superposition. In yet another example, the energy consumption unit comprises a voltage control unit 101, which is connected with the charge storage component C1, and is configured to convert the voltage across the charge storage component C1 to a predetermined value of voltage after the switch unit 1 switches on and then switches off and before the energy superposition unit performs energy superposition.

In yet another example, wherein: the heating circuit further comprises an energy consumption unit, which is connected with the charge storage component C1, and is configured to consume the energy in the charge storage component C1 after the switch unit 1 switches on and then switches off and before the energy transfer unit performs energy transfer, or consume the energy in the charge storage component C1 after the energy transfer unit performs energy transfer. In yet another example, wherein: the energy consumption unit comprises a voltage control unit 101, which is connected with the charge storage component C1, and is configured to convert the voltage across the charge storage component C1 to a predetermined value of voltage after the switch unit 1 switches on and then switches off and before the energy transfer unit performs energy transfer, or convert the voltage across the charge storage component C1 to a predetermined value of voltage after the energy transfer unit performs energy transfer. In yet another example, wherein: the heating circuit further comprises an energy consumption unit, which is connected with the charge storage component C1, and is configured to consume the energy in the charge storage component C1 after the switch unit 1 switches on and then switches off and before the energy superposition and transfer unit performs energy transfer, or consume the energy in the charge storage component after the energy superposition and transfer unit performs energy transfer and before the energy superposition and transfer unit performs energy superposition. In yet another example, wherein: the energy consumption unit comprises a voltage control unit 101, which is connected with the charge storage component C1, and is configured to convert the voltage across the charge storage component C1 to a predetermined value of voltage after the switch unit 1 switches on and then switches off and before the energy superposition and transfer unit performs energy transfer, or convert the voltage across the charge storage component C1 to a predetermined value of voltage after the energy superposition and transfer unit performs energy transfer and before the energy superposition and transfer unit performs energy superposition.

In yet another example, wherein: the voltage control unit 101 comprises a damping component R5 and a switch K8; the damping component R5 and the switch K8 are connected with each other in series, and then connected in parallel across the charge storage component C1; the switching control module 100 is further connected with the switch K8, and is configured to control the switch K8 to switch on after the switch unit 1 switches on and then switches off. In yet another example, wherein: the switching control module 100 is configured to control the switch unit 1 to switch off when or after the current flowing through the switch unit 1 reaches zero after the switch unit 1 switches on. In yet another example, wherein: the heating circuit further comprises a freewheeling circuit 20, which keeps the energy flowing to the battery after the switch unit 1 switches off during energy flowing from the energy storage circuit to the battery. In yet another example, wherein: one end of the freewheeling circuit 20 is connected to the negative electrode of the battery, and the other end of the freewheeling circuit 20 is connected to the second one-way branch, so that the freewheeling current flows through the current storage component L11.

In yet another example, wherein: the damping component R1 is the parasitic resistance in the battery, and the current storage component L1 is the parasitic inductance in the battery. In yet another example, wherein: the damping component R1 is a resistor, the current storage component L1 is an inductor, and the charge storage component C1 is a capacitor.

Certain embodiments of the present invention provide a battery heating circuit, comprising a switch unit 1, a switching control module 100, a damping component R1, an energy storage circuit, and an energy limiting circuit, wherein: the energy storage circuit is connected with the battery, and comprises a current storage component L1 and a charge storage component C1; the damping component R1, the switch unit 1, the current storage component L1, and the charge storage component C1 are connected in series; the switching control module 100 is connected with the switch unit 1, and is configured to control ON/OFF of the switch unit 1, so that the energy can flow back-and-forth between the battery and the energy storage circuit when the switch unit 1 switches on; the energy limiting circuit is configured to limit the magnitude of current flowing from the energy storage circuit to the battery. For example, the battery heating circuit provided in certain embodiments of the present invention can avoid the safety problem caused by over-current in the heating circuit, so as to protect the battery efficiently.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:
1. A circuit for heating a battery, the circuit comprising:
the battery including a first damping component and a first current storage component, the first damping component and the first current storage component being parasitic to the battery, the battery including a first battery terminal and a second battery terminal;
a switch unit;
a switching control component coupled to the switch unit;
a first charge storage component including a first storage terminal and a second storage terminal, the first charge storage component and the first current storage component being at least parts of an energy storage circuit; and
a current limiting circuit;
wherein:
the first damping component, the first current storage component, the switch unit, and the first charge storage component are connected;
the switching control component is configured to turn on the switch unit so as to control a first current flowing from the battery to the first charge storage component and a second current flowing from the first charge storage component to the battery; and
the current limiting circuit is configured to limit the second current flowing from the first charge storage component to the battery;
wherein the circuit for heating the battery is configured to heat the battery by at least discharging and charging the battery;
wherein the switch unit includes a first branch circuit for conduction in a first direction and a second branch circuit for conduction in a second direction, the first direction being from the battery to the first charge storage component, the second direction being from the first charge storage component to the battery;
wherein the current limiting circuit includes a second current storage component connected in series with the second branch circuit; wherein:
the first branch circuit includes a first switch and a first one-way semiconductor component connected in series with the first switch, the first switch being coupled to the switching control component; and
the second branch circuit includes a second one-way semiconductor component;
wherein the switching control component is further configured to turn on and off the first branch circuit by turning on and off the first switch respectively;
the second branch circuit further includes a second switch coupled to the switching control component and connected in series with the second one-way semiconductor component;
wherein the switching control component is further configured to turn on and off the second branch circuit by turning on and off the second switch respectively;
the circuit for heating the battery further comprising:
a third one-way semiconductor component coupled to the second switch and the second current storage component;

a fourth one-way semiconductor component coupled to the second one-way semiconductor component and the second current storage component;

a third switch coupled to the third one-way semiconductor component and the battery; and a fourth switch coupled to the fourth one-way semiconductor component and the battery;

wherein:

the switching control component is coupled to the third switch and further configured to turn on and off the third switch; and the switching control component is coupled to the fourth switch and further configured to turn on and off the fourth switch.

2. The circuit of claim 1 wherein:

the first damping component is a parasitic resistor of the battery; and the first current storage component is a parasitic inductor of the battery.

3. The circuit of claim 2 wherein the first charge storage component is a capacitor.

4. The circuit of claim 1 and further comprising a freewheeling circuit configured to allow a freewheeling current to flow to the battery after the second branch circuit is turned off.

5. The circuit of claim 4 wherein the freewheeling circuit is coupled to the battery and the second branch circuit, and is configured to allow the freewheeling current to flow through the current limiting circuit.

6. The circuit of claim 1 wherein the switching control component is further configured to:

turn on the first switch to allow the first current to flow from the battery to the first charge storage component;

turn off the first switch and turn on the second switch to allow the second current to flow from the first charge storage component to the battery;

if a storage voltage associated with the first charge storage component drops to a predetermined voltage level in magnitude, turn off the second switch and turn on the third switch; and if a third current flowing through the second current storage component reaches zero in magnitude, turn off the third switch and turn on the second switch and the fourth switch to invert a voltage polarity of the storage voltage.

7. The circuit of claim 1 wherein the switching control component is further configured to:

turn on the first switch to allow the first current to flow from the battery to the first charge storage component;

turn off the first switch and turn on the second switch to allow the second current to flow from the first charge storage component to the battery;

if a storage voltage associated with the first charge storage component drops to a predetermined voltage level in magnitude, turn off the second switch and turn on the third switch;

if a third current flowing through the second current storage component drops to a first predetermined current level in magnitude, turn off the third switch and turn on the second switch and the fourth switch, the first predetermined current level being larger than zero in magnitude;

if the third current rises to a second predetermined current level in magnitude, turn off the fourth switch so that the third current flows to the battery, the second predetermined current level being larger than the first predetermined current level in magnitude; and if the third current reaches zero in magnitude, turn on the second switch and the fourth switch to invert a voltage polarity of the storage voltage.

8. The circuit of claim 1, and further comprising an energy superposition unit coupled to the first charge storage component and configured to, after the switch unit is turned on and then turned off, adjust a storage voltage associated with the first charge storage component so that a positive voltage terminal of the first charge storage component is coupled, directly or indirectly, to a negative voltage terminal of the battery.

9. The circuit of claim 8 wherein the energy superposition unit includes a polarity inversion unit coupled to the first charge storage component and configured to, after the switch unit is turned on and then turned off, invert a voltage polarity associated with the first charge storage component.

10. The circuit of claim 9 wherein the polarity inversion unit includes:

a first single-pole double-throw switch including a first input wire, a first output wire, and a second output wire, the first input wire being coupled, directly or indirectly, to the first battery terminal, the first output wire and the second output wire being coupled to the first storage terminal and the second storage terminal respectively; and a second single-pole double-throw switch including a second input wire, a third output wire, and a fourth output wire, the second input wire being coupled, directly or indirectly, to the second battery terminal, the third output wire and the fourth output wire being coupled to the second storage terminal and the first storage terminal respectively;

wherein the switching control component is coupled to the first single-pole double-throw switch and the second single-pole double-throw switch, and is configured to invert the voltage polarity associated with the first charge storage component by altering connection relationships among the first input wire, the first output wire, the second output wire, the second input wire, the third output wire, and the fourth output wire.

11. The circuit of claim 9 wherein the polarity inversion unit includes:

a third current storage component;

a fifth switch; and a fifth one-way semiconductor component connected between the first charge storage component and the third current storage component or between the third current storage component and the fifth switch;

wherein:

the first charge storage component, the fifth one-way semiconductor component, the third current storage component, and the fifth switch are at least parts of a polarity inversion loop; and the switching control component is coupled to the fifth switch and is configured to invert the voltage polarity associated with the first charge storage component by turning on the fifth switch.

12. The circuit of claim 9 wherein the polarity inversion unit includes:

a second charge storage component; and a first DC-DC module coupled to the second charge storage component and the first charge storage component;

wherein the switching control component is coupled to the first DC-DC module and configured to invert the voltage polarity associated with the first charge storage component by transferring energy from the first charge storage component to the second charge storage component and then transferring the energy from the second charge storage component back to the first charge storage component.

13. The circuit of claim 8, and further comprising an energy consumption unit coupled to the first charge storage component and configured to consume energy stored in the first charge storage component after the switch unit is turned on and then turned off but before the storage voltage is adjusted by the energy superposition unit.

14. The circuit of claim 13 wherein the energy consumption unit includes a voltage control unit configured to regulate the storage voltage associated with the first charge storage component to a predetermined voltage after the switch unit is turned on and then turned off but before the storage voltage is adjusted by the energy superposition unit.

15. The circuit of claim 14 wherein the voltage control unit includes:
   a second damping component; and
   a fifth switch connected in series with the second damping component;
   wherein the first charge storage component is connected in parallel with a combination of the second damping component and the fifth switch.

16. The circuit of claim 1 wherein the switching control component is configured to:
   turn on the switch unit to allow at least the second current to flow from the first charge storage component to the battery; and
   then, turn off the switch unit when or after the second current decreases to zero in magnitude.

17. The circuit of claim 1, and further comprising an energy transfer unit coupled to the first charge storage component and configured to, after the switch unit is turned on and then turned off, transfer first energy from the first charge storage component to an energy storage component.

18. The circuit of claim 17 wherein:
   the energy storage component includes the battery; and
   the energy transfer unit includes an electricity recharge unit coupled to the battery and configured to transfer the first energy from the first charge storage component to the battery after the switch unit is turned on and then turned off.

19. The circuit of claim 18 wherein:
   the electricity recharge unit includes a DC-DC module coupled to the first charge storage component and the battery; and
   the switching control component is coupled to the DC-DC module and configured to control the DC-DC module to transfer the first energy from the first charge storage component to the battery.

20. The circuit of claim 17, and further comprising an energy consumption unit coupled to the first charge storage component and configured to consume second energy stored in the first charge storage component after the switch unit is turned on and then turned off.

21. The circuit of claim 20 wherein the energy consumption unit is further configured to consume the second energy stored in the first charge storage component after the switch unit is turned on and then turned off but before the energy transfer unit transfers the first energy from the first charge storage component to the energy storage component.

22. The circuit of claim 20 wherein the energy consumption unit is further configured to consume the second energy stored in the first charge storage component after the switch unit is turned on and then turned off and after the energy transfer unit transfers the first energy from the first charge storage component to the energy storage component.

23. The circuit of claim 1, and further comprising an energy transfer and superposition unit coupled to the first charge storage component and configured to, after the switch unit is turned on and then turned off, transfer first energy from the first charge storage component to an energy storage component and then adjust a storage voltage associated with the first charge storage component so that a positive voltage terminal of the first charge storage component is coupled, directly or indirectly, to a negative voltage terminal of the battery.

24. The circuit of claim 23 wherein:
   the energy transfer and superposition unit includes an energy transfer unit and an energy superposition unit;
   the energy transfer unit is coupled to the first charge storage component and configured to, after the switch unit is turned on and then turned off, transfer the first energy from the first charge storage component to the energy storage component; and
   the energy superposition unit is coupled to the first charge storage component and configured to adjust the storage voltage associated with the first charge storage component so that the positive voltage terminal of the first charge storage component is coupled, directly or indirectly, to the negative voltage terminal of the battery.

25. The circuit of claim 24 wherein:
   the energy storage component includes the battery; and
   the energy transfer unit includes an electricity recharge unit coupled to the battery and configured to transfer the first energy from the first charge storage component to the battery after the switch unit is turned on and then turned off.

26. The circuit of claim 23 wherein:
   the energy storage component includes the battery;
   the energy transfer and superposition unit includes a DC-DC module coupled to the first charge storage component and the battery; and
   the switching control component is coupled to the DC-DC module and configured to control the DC-DC module to transfer the first energy from the first charge storage component to the battery and then adjust the storage voltage associated with the first charge storage component so that the positive voltage terminal of the first charge storage component is coupled, directly or indirectly, to the negative voltage terminal of the battery.

27. The circuit of claim 23, and further comprising an energy consumption unit coupled to the first charge storage component and configured to consume second energy stored in the first charge storage component after the switch unit is turned on and then turned off.

28. The circuit of claim 27 wherein the energy consumption unit is further configured to consume the second energy stored in the first charge storage component after the switch unit is turned on and then turned off but before the energy transfer and superposition unit transfers the first energy from the first charge storage component to the energy storage component.

29. The circuit of claim 27 wherein the energy consumption unit is further configured to consume the second energy stored in the first charge storage component after the switch unit is turned on and then turned off and after the energy transfer and superposition unit transfers the first energy from the first charge storage component to the energy storage component.

30. The circuit of claim 1, and further comprising an energy consumption unit coupled to the first charge storage component and configured to consume energy stored in the first charge storage component after the switch unit is turned on and then turned off.

31. The circuit of claim 30 wherein the energy consumption unit includes a voltage control unit configured to regulate a storage voltage associated with the first charge storage component to a predetermined voltage after the switch unit is turned on and then turned off.

32. The circuit of claim 1 is further configured to:
start heating the battery if at least one heating start condition is satisfied; and
stop heating the battery if at least one heating stop condition is satisfied.

* * * * *